(12) United States Patent
Lee et al.

(10) Patent No.: US 11,178,799 B2
(45) Date of Patent: Nov. 16, 2021

(54) ELECTRONIC DEVICE

(71) Applicant: Samsung Electronics Co., Ltd.,
Gyeonggi-do (KR)

(72) Inventors: Hae-Jin Lee, Seoul (KR); Oh-Hyuck Kwon, Gyeonggi-do (KR); Min Park, Gyeonggi-do (KR); Jung-Je Bang, Gyeonggi-do (KR); Jae-Deok Lim, Gyeonggi-do (KR); Kyung-Ha Koo, Seoul (KR); Jae-Heung Ye, Gyeonggi-do (KR); Chang-Tae Kim, Gyeonggi-do (KR); Chi-Hyun Cho, Gyeonggi-do (KR)

(73) Assignee: Samsung Electronics Co., Ltd

( * ) Notice: Subject to any disclaimer, the term of this patent is extended or adjusted under 35 U.S.C. 154(b) by 294 days.

(21) Appl. No.: 15/938,689

(22) Filed: Mar. 28, 2018

(65) Prior Publication Data

US 2018/0288908 A1 Oct. 4, 2018

(30) Foreign Application Priority Data

Mar. 28, 2017 (KR) .................. 10-2017-0039554

(51) Int. Cl.
*H05K 9/00* (2006.01)
*H05K 7/20* (2006.01)
(Continued)

(52) U.S. Cl.
CPC ........... *H05K 9/003* (2013.01); *H05K 1/0203* (2013.01); *H05K 1/0216* (2013.01); *H05K 1/181* (2013.01);
(Continued)

(58) Field of Classification Search
CPC .... H05K 9/003; H05K 9/0032; H05K 9/0088; H05K 7/20454; H05K 7/20472;
(Continued)

(56) References Cited

U.S. PATENT DOCUMENTS 6,310,773 B1 10/2001 Yusuf et al.
2012/0218727 A1 8/2012 Kim
(Continued)

FOREIGN PATENT DOCUMENTS

CN 202496164 10/2012
CN 102904986 1/2013
(Continued)

OTHER PUBLICATIONS

European Search Report dated Dec. 3, 2019 issued in counterpart application No. 18777325.4-1203, 7 pages.
(Continued)

*Primary Examiner* — Anatoly Vortman
*Assistant Examiner* — Zhengfu J Feng
(74) *Attorney, Agent, or Firm* — The Farrell Law Firm, P.C.

(57) ABSTRACT

Disclosed is an electronic device including a shielding member. The electronic device includes a substrate having an electric element mounted thereon; a shield can mounted on the electric element and including an opening formed at a part facing the electric element; a shielding member mounted around a part in which the opening is formed on an outer surface of the shield can, and electrically connected to the shield can; a metal plate mounted on the shielding member, with the opening covered, and electrically connected to the shielding member; and a heat conductive member mounted in the opening and interposed between the electric element and the metal plate, and in contact with the electric element and the metal plate.

18 Claims, 20 Drawing Sheets

(51) Int. Cl.
*H05K 1/02* (2006.01)
*H05K 1/18* (2006.01)

(52) U.S. Cl.
CPC ..... *H05K 7/20336* (2013.01); *H05K 7/20454* (2013.01); *H05K 7/20472* (2013.01); *H05K 9/0032* (2013.01); *H05K 9/0088* (2013.01); *H05K 2201/10371* (2013.01)

(58) Field of Classification Search
CPC .............. H05K 7/20336; H05K 1/0203; H05K 1/0216; H05K 1/181; H05K 2201/10371
USPC ........................................................ 361/700
See application file for complete search history.

(56) References Cited

U.S. PATENT DOCUMENTS

| | | |
|---|---|---|
| 2013/0027892 A1 | 1/2013 | Lim et al. |
| 2014/0247559 A1 | 9/2014 | Wu |
| 2015/0131225 A1 | 5/2015 | Chang |
| 2015/0241936 A1 | 8/2015 | Hur et al. |
| 2016/0301442 A1* | 10/2016 | Sohn ............... H04M 1/19 |
| 2017/0098592 A1 | 4/2017 | Jin et al. |
| 2017/0309542 A1* | 10/2017 | Aramaki ........... H01L 23/3737 |
| 2018/0198305 A1* | 7/2018 | Hwang ............... H02J 7/02 |

FOREIGN PATENT DOCUMENTS

| | | |
|---|---|---|
| CN | 104640414 | 5/2015 |
| CN | 104813760 | 7/2015 |
| CN | 204598200 | 8/2015 |
| CN | 104981347 | 10/2015 |
| CN | 106413369 | 2/2017 |
| JP | 2001148586 | 5/2001 |
| JP | 2004072051 | 3/2004 |
| JP | 2016-092407 | 5/2016 |
| JP | 2017-038086 | 2/2017 |
| KR | 1020160120495 | 10/2016 |
| KR | 1020160142720 | 12/2016 |
| KR | 1020170097541 | 8/2017 |
| WO | WO 2017/014493 | 1/2017 |

OTHER PUBLICATIONS

International Search Report dated Jul. 6, 2018 issued in counterpart application No. PCT/KR2018/003373, 10 pages.
Chinese Office Action dated Mar. 16, 2020 issued in counterpart application No. 201880016333.X, 18 pages.
Korean Office Action dated Jun. 29, 2021 issued in counterpart application No. 10-2017-0039554, 13 pages.
European Search Report dated Feb. 8, 2021 issued in counterpart application No. 18777325.4-1203, 6 pages.

* cited by examiner

ELECTRONIC DEVICE

PRIORITY

This application claims priority under 35 U.S.C. § 119(a) to Korean Patent Application Serial No. 10-2017-0039554, which was filed in the Korean Intellectual Property Office on Mar. 28, 2017, the entire content of which is incorporated herein by reference.

BACKGROUND

1. Field of the Disclosure

The present disclosure relates generally to an electronic device including a shielding member for discharging heat or shielding electromagnetic waves generated from an electric element disposed inside the electronic device.

2. Description of the Related Art

In view of the recent trends of electronic devices toward reduced size, additional functionality, and increased performance, electric elements with high power per unit area have been developed. Such electric elements are typically mounted on a printed circuit board (PCB) with limited size, thus acting as a main heat source in an electronic device.

Additionally, the electric elements may generate electromagnetic waves, which may lead to a malfunction of the electronic device.

To shield the electromagnetic waves of the electric elements, one approach is to dispose a metal shield can surrounding the electric parts. The shield may shield the electromagnetic waves generated from the electric elements.

However, since the shield can traps heat generated from the electric parts, the internal temperature of the electric elements may increase. As a result, the performance of the electric elements may degrade when the heat is not dissipated to the outside. Rather, the heat is transferred to a product surface and adjacent electric elements through the PCB, thereby possibly resulting in performance degradation and a malfunction of the electronic device.

SUMMARY

An aspect of the present disclosure is to address at least the above-mentioned problems or disadvantages and to provide at least the advantages described below. Accordingly, an aspect of the present disclosure is to provide an electronic device including a shielding member for shielding electromagnetic waves of at least one electric element and efficiently discharging heat from at least one electric element.

In accordance with an aspect of the present disclosure, an electronic device is provided. The electronic device includes a substrate including an electric element mounted thereon; a shield can mounted on the electric element and including an opening formed at a part facing the electric element; a shielding member mounted around a part in which the opening is formed on an outer surface of the shield can, and electrically connected to the shield can; a metal plate mounted on the shielding member, with the opening covered, and electrically connected to the shielding member; and a heat conductive member mounted in the opening and interposed between the electric element and the metal plate, and in contact with the electric element and the metal plate.

In accordance with another aspect of the present disclosure, an electronic device is provided. The electronic device a substrate having an electric element mounted thereon; a shield can mounted on the electric element and including a first opening formed at a part facing the electric element; a shielding member mounted around a part in which the first opening is formed on a first surface of the shield can, and including a second opening electrically connected to the shield can; a metal plate mounted on the shielding member, with the first opening covered, and electrically connected to the shielding member; and a heat conductive member mounted in the first opening and interposed between the electric element and the metal plate, and in contact with the electric element and the metal plate. In accordance with another aspect of the present disclosure, a method for assembling an electronic device is provided a. The method includes creating a substrate including an electric element mounted thereon; disposing a shield can including at least one first opening at a part facing the electric element on the substrate; disposing a shielding member to cover a first surface of the shield can, the shielding member being compressed when being pressed, and including at least one second opening for discharging heat of the electric element, and a shielding film engaged with an exterior of the shielding member; disposing a metal plate to cover a first surface of the shielding member, mounting a heat conductive member on a first surface of the metal plate, mounting an insulation film on a second surface opposite to the first surface of the metal plate, and disposing the heat conductive member to face a first surface of the electric element, in engagement with the first and second openings; and mounting the metal plate on a first surface of the insulation film, and mounting at least one cooling member on a second surface opposite to the first surface of the insulation film. The insulation film transfers heat from the heat conductive member to the at least one cooling member through the metal plate.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
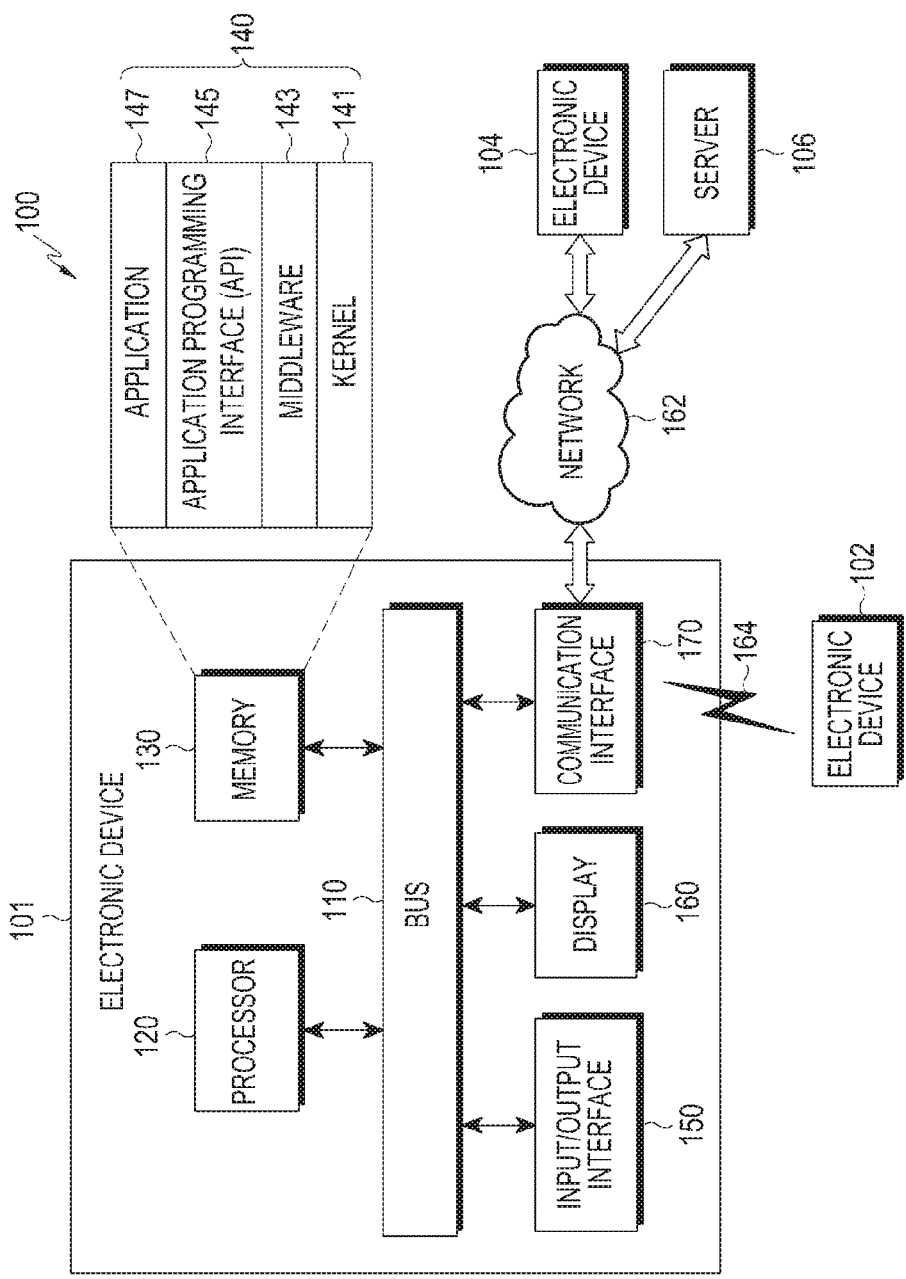
FIG. 1 is a block diagram illustrating a network environment including electronic devices, according to various embodiments of the present disclosure.

The embodiments and terms used herein are not intended to limit the technology disclosed herein to specific forms, and should be understood to include various modifications, equivalents, and/or alternatives to the corresponding embodiments. In describing the drawings, similar reference numerals may be used to designate similar elements A singular expressions may include a plural. In the present disclosure, the terms "A or B", or "at least one of A or B" may cover all possible combinations of the enumerated items.

The term as used in the present disclosure, "first" or "second" may modify the names of components irrespective of sequence or importance. These expressions are used to distinguish one component from another component, not limiting the components. When it is said that a component (for example, a first component) is '(operatively or communicatively) coupled with/to' or 'connected to' another component (for example, a second component), it should be understood that the one component is connected to the other component directly or through any other component (for example, a third component).

The expression "configured to" as used herein may be interchangeably used with, for example, "suitable for", "having the capacity to", "designed to", "adapted to", "made to", or "capable of" in terms of hardware or software, according to circumstances. Alternatively, in some situations, the expression "configured to" may mean that a device is "capable of". For example, the phrase "processor configured to execute A, B, and C" may mean a dedicated processor (e.g., an embedded processor) for performing the corresponding operations or a generic-purpose processor (e.g., a central processing unit (CPU) or an application processor (AP)) that can perform the corresponding operations.

According to various embodiments of the present disclosure, an electronic device may include at least one of, for example, a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), an MP3 player, medical equipment, a camera, or an wearable device. The wearable device may include at least one of an accessory type (e.g., a watch, a ring, a bracelet, an ankle bracelet, a necklace, glasses, contact lenses, or a head-mounted device (HMD)), a fabric or clothing integrated type (e.g., electronic clothes), an attached type (e.g., a skin pad or a tattoo), or an implantable circuit. The electronic device may include at least one of a television (TV), a digital versatile disk (DVD) player, an audio player, a refrigerator, an air conditioner, a vacuum cleaner, an oven, a microwave oven, a washing machine, an air purifier, a set-top box, a home automation control panel, a security control panel, a media box (e.g., Samsung HomeSync™, Apple TV™, Google TV™, etc.), a game console (e.g., Xbox™, PlayStation™, etc.), an electronic dictionary, an electronic key, a camcorder, or an electronic picture frame.

According to various embodiments of the present disclosure, an electronic device may include at least one of various medical devices (e.g., a portable medical meter (e.g., a blood glucose meter, a heart rate meter, a blood pressure meter, a body temperature meter, etc.), a magnetic resonance angiography (MRA) device, a magnetic resonance imaging (MRI) device, a computed tomography (CT) device, an imaging device, an ultrasonic device, etc.), a navigation device, a global navigation satellite system (GNSS), an event data recorder (EDR), a flight data recorder (FDR), an vehicle infotainment device, a naval electronic device (e.g., a naval navigation device, a gyrocompass, etc.), an avionic electronic device, a security device, an automotive head unit, an industrial or consumer robot, a drone, an automatic teller machine (ATM), a point of sales (POS) device, or an Internet of things (IoT) device (e.g., a light bulb, various sensors, an electric or gas meter, a sprinkler device, a fire alarm, a thermostat, a streetlamp, a toaster, sporting goods, a hot water tank, a heater, a boiler, etc.).

An electronic device may include at least one of a part of furniture or a building/structure or a vehicle, an electronic board, an electronic signature receiving device, a projector, or various measuring devices (e.g., a water meter, an electric meter, a gas or electromagnetic wave measuring device). The electronic device may be flexible, or a combination of two or more of the foregoing devices. The electronic device is not limited to the foregoing devices. In the present disclosure, the term "user" may indicate a person using an electronic device or a device (e.g., artificial intelligence electronic device) using an electronic device.

FIG. 1 is a block diagram illustrating a network environment including electronic devices, according to various embodiments of the present disclosure;

Referring to FIG. 1, an electronic device 101 in a network environment 100 may include a bus 110, a processor 120, a memory 130, an input/output (I/O) interface 150, a display 160, and a communication interface 170. At least one of the components may be omitted from the electronic device 101 or a component may be added to the electronic device 101. The bus 110 may include a circuit that interconnects the processor 120, the memory 130, the I/O interface 150, the display 160, and the communication interface 170, and allows communication (e.g., control messages or data) between the foregoing components. The processor 120 may include one or more of a CPU, an AP, or a communication processor (CP). The processor 120 may execute computation or data processing related to control or communication of at least one other component of the electronic device 101. The processor 120 may be called a controller.

The memory 130 may include a volatile memory or a non-volatile memory. The memory 130 may, for example, store instructions or data related to at least one other component of the electronic device 101. According to an embodiment of the present disclosure, the memory 130 may store software or programs 140. The programs 140 may include, for example, a kernel 141, middleware 143, an application programming interface (API) 145, or applications 147. At least some of the kernel 141, the middleware 143, and the API 145 may be called an operating system (OS). The kernel 141 may control or manage system resources (e.g., the bus 110, the processor 120, or the memory 130) that are used in executing operations or functions implemented in other programs (e.g., the middleware 143, the API 145, or the applications 147). Also, the kernel 141 may provide an interface for allowing the middleware 143, the API 145, or the applications 147 to access individual components of the electronic device 101, and control or manage system resources.

The middleware 143 may serve as a medium through which the kernel 141 may communicate with, for example, the API 145 or the applications 147 to transmit and receive data. Also, the middleware 143 may process one or more task requests received from the applications 147 according to their priority levels. For example, the middleware 143 may assign priority levels for using system resources (e.g., the bus 110, the processor 120, or the memory 130) of the electronic device 101 to the applications 147, and process the one or more task requests according to the priority levels.

The API 145 is an interface for the applications 147 to control functions that the kernel 141 or the middleware 143 provides. The API 145 may include at least one interface or function (e.g., a command) for file control, window control, video processing, or text control.

The I/O interface 150 may provide a command or data received from a user or an external device to the other component(s) of the electronic device 101, or output a command or data received from the other component(s) of the electronic device 101 to the user or the external device.

The display 160 may include, for example, a liquid crystal display (LCD), a light emitting diode (LED) display, an organic LED (OLED) display, a microelectromechanical systems (MEMS) display, or an electronic paper display. The display 160 may display, for example, various types of content (e.g., text, an image, a video, an icon, or a symbol) to the user. The display 160 may include a touch screen and receive, for example, a touch input, a gesture input, a proximity input, or a hovering input through an electronic pen or a user's body part.

The communication interface 170 may establish communication, for example, between the electronic device 101 and an external device (e.g., a first external electronic device 102, a second external electronic device 104, or a server 106). For example, the communication interface 170 may be connected to a network 162 by wireless communication or wired communication, and communicate with the external device (e.g., the second external electronic device 104 or the server 106) over the network 162.

The wireless communication may include, for example, cellular communication that uses at least one of long term evolution (LTE), LTE-advanced (LTE-A), code division multiple access (CDMA), wideband CDMA (WCDMA), universal mobile telecommunication system (UMTS), wireless broadband (WiBro), or global system for mobile communications (GSM). According to an embodiment of the present disclosure, the wireless communication may include at least one of wireless fidelity (WiFi), Bluetooth™, Bluetooth low energy (BLE), Zigbee, near field communication (NFC), magnetic secure transmission (MST), radio frequency (RF), or body area network (BAN), as indicated by the short term communication network 164. The wireless communication may include GNSS. GNSS may be, for example, a global positioning system (GPS), a global navigation satellite system (Glonass), a Beidou navigation satellite system (Beidou), or Galileo, the European global satellite-based navigation system. Hereinafter, in the present disclosure, the terms "GPS" and may be interchangeable used with the term "GNSS". The wired communication may include at least one of a universal serial bus (USB), a high definition multimedia interface (HDMI), a recommended standard 232 (RS-232), a power line communication, or a plain old telephone service (POTS). The network 162 may be a telecommunication network, for example, at least one of a computer network (e.g., local area network (LAN) or wide area network (WAN)), the Internet, or a telephone network.

Each of the first and second external electronic devices 102 and 104 may be of the same type as or a different type from the electronic device 101. According to various embodiments of the present disclosure, all or a part of operations performed in the electronic device 101 may be performed in one or more other electronic devices (e.g., the electronic devices 102 and 104) or the server 106. If the electronic device 101 is to perform a function or a service automatically or upon request, the electronic device 101 may request at least a part of functions related to the function or the service to another device (e.g., the electronic device 102 or 104, or the server 106), instead of performing the function or the service autonomously, or additionally. The other electronic device may execute the requested function or an additional function and provide a result of the function execution to the electronic device 101. The electronic device 101 may provide the requested function or service based on the received result or by additionally processing the received result. For this purpose cloud computing, distributed computing, or client-server computing may be used.

Figure 2:
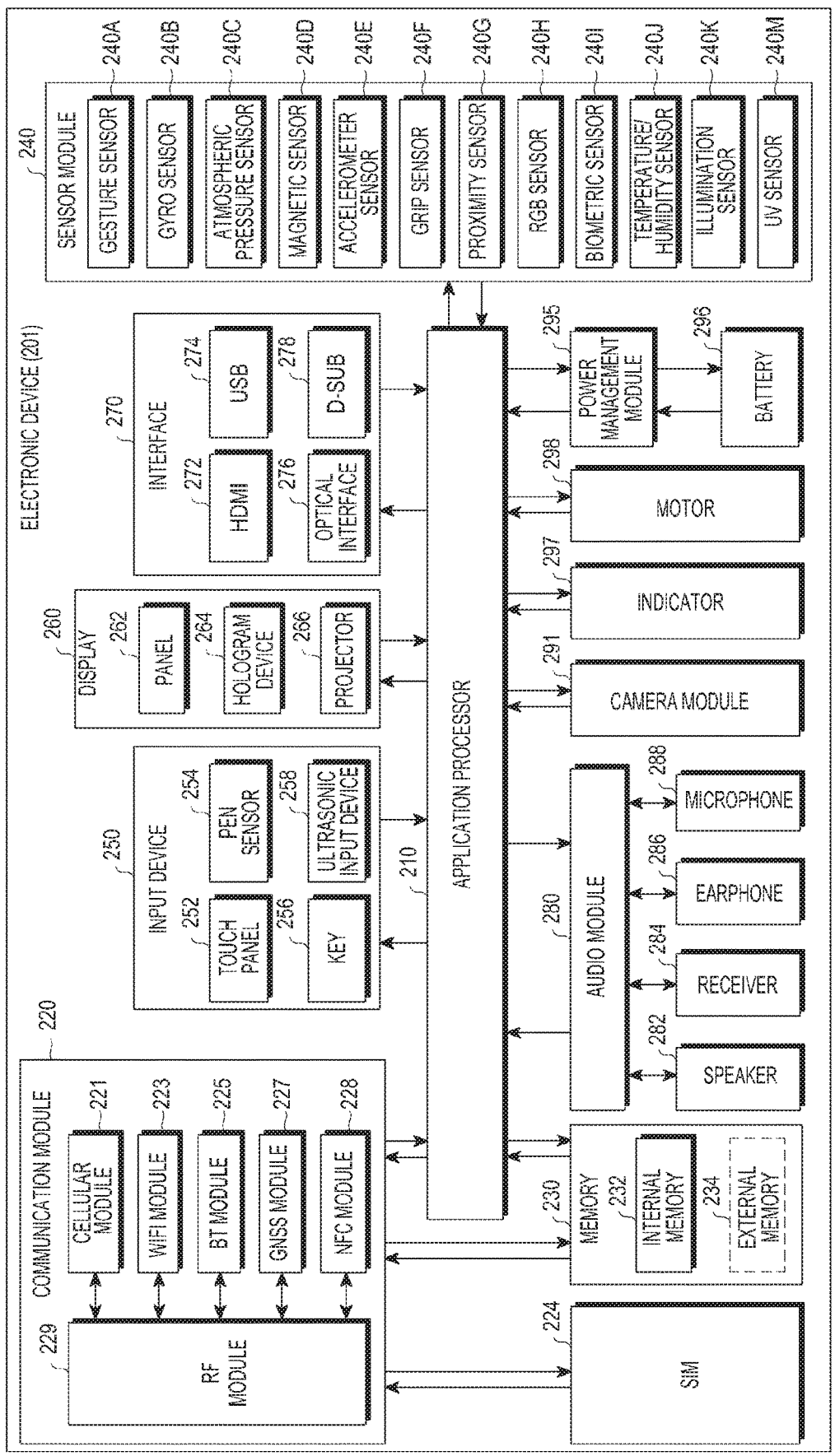
FIG. 2 is a block diagram illustrating an electronic device, according to various embodiments of the present disclosure.

FIG. 2 is a block diagram of an electronic device 201, according to various embodiments of the present disclosure. The electronic device 201 may include, for example, the whole or part of the electronic device 101. The electronic device 201 may include at least one processor 210 (e.g., AP), a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298. The processor 210 may, for example, control a plurality of hardware or software components that are connected to the processor 210 by executing an OS or an application program, and may perform processing or computation of various types of data. The processor 210 may be implemented, for example, as a system on chip (SoC). The processor 210 may further include a graphics processing unit (GPU) or an image signal processor (ISP). The processor 210 may include at least a part (e.g., a cellular module 221) of the electronic device 201. The processor 210 may load a command or data received from at least one of other components (e.g., a non-volatile memory), process the loaded command or data, and store result data in the non-volatile memory.

The communication module 220 may have the same configuration as or a similar configuration to that of the communication interface 170. The communication module 220 may include, for example, the cellular module 221, a WiFi module 223, a Bluetooth (BT) module 225, a GNSS module 227, an NFC module 228, and an RF module 229. The cellular module 221 may provide services such as a voice call, a video call, a text service, or the Internet service through a communication network. According to an embodiment of the present disclosure, the cellular module 221 may identify and authenticate the electronic device 201 within a communication network, using the SIM 224 (e.g., a SIM card). The cellular module 221 may perform at least a part of the functionalities of the processor 210. The cellular module 221 may include a CP. At least a part (e.g., two or more) of the cellular module 221, the WiFi module 223, the BT module 225, the GNSS module 227, or the NFC module 228 may be included in a single integrated (IC) chip or IC package. The RF module 229 may transmit and receive, for example, communication signals (e.g., RF signals). The RF module 229 may include, for example, a transceiver, a power amplifier module (PAM), a frequency filter, a low noise amplifier (LNA), an antenna, etc. At least one of the cellular module 221, the WiFi module 223, the BT module 225, the GNSS module 227, or the NFC module 228 may transmit and receive RF signals via a separate RF module. The SIM 224 may include, for example, a card including the SIM or an embedded SIM. The SIM 224 may include a unique identifier (e.g., integrated circuit card identifier (ICCID)) or subscriber information (e.g., international mobile subscriber identity (IMSI)).

The memory 230 may include, for example, an internal memory 232 or an external memory 234. The internal memory 232 may be at least one of, for example, a volatile memory (e.g., dynamic RAM (DRAM), static RAM (SRAM), or synchronous dynamic RAM (SDRAM)), and a non-volatile memory (e.g., one time programmable ROM (OTPROM), programmable ROM (PROM), erasable and programmable ROM (EPROM), electrically erasable and programmable ROM (EEPROM), mask ROM, flash ROM, flash memory, a hard drive, or a solid state drive (SSD)). The external memory 234 may include a flash drive such as a compact flash (CF) drive, a secure digital (SD), a micro secure digital (micro-SD), a mini secure digital (mini-SD), an extreme digital (xD), a multi-media card (MMC), or a memory stick. The external memory 234 may be operatively or physically coupled to the electronic device 201 via various interfaces.

The sensor module 240 may, for example, measure physical quantities or detect operational states of the electronic device 201, and convert the measured or detected information into electric signals. The sensor module 240 may include at least one of, for example, a gesture sensor 240A, a gyro sensor 240B, an atmospheric pressure sensor 240C, a magnetic sensor 240D, an accelerometer sensor 240E, a grip sensor 240F, a proximity sensor 240G, a color sensor 240H (e.g., a red, green, blue (RGB) sensor), a biometric sensor 240I, a temperature/humidity sensor 240J, an illumination sensor 240K, or an ultra violet (UV) sensor 240M. Additionally or alternatively, the sensor module 240 may include, for example, an electrical-nose (E-nose) sensor, an electromyogram (EMG) sensor, an electroencephaloeram (EEG) sensor, an electrocardiogram (ECG) sensor, an infrared (IR) sensor, an iris sensor, or a finger print sensor. The sensor module 240 may further include a control circuit for controlling one or more sensors included therein. According to various embodiments of the present disclosure, the electronic device 201 may further include a processor configured to control the sensor module 240, as a part of or separately from the processor 210. Thus, while the processor 210 is in a sleep state, the control circuit may control the sensor module 240.

The input device 250 may include, for example, a touch panel 252, a (digital) pen sensor 254, a key 256, or an ultrasonic input device 258. The touch panel 252 may operate in at least one of, for example, capacitive, resistive, infrared, and ultrasonic schemes. The touch panel 252 may further include a control circuit. The touch panel 252 may further include a tactile layer to thereby provide haptic feedback to the user. The (digital) pen sensor 254 may include, for example, a detection sheet which is a part of the touch panel or separately configured from the touch panel. The key 256 may include, for example, a physical button, an optical key, or a keypad. The ultrasonic input device 258 may sense ultrasonic signals generated by an input tool using a microphone 288, and identify data corresponding to the sensed ultrasonic signals.

The display 260 may include a panel 262, a hologram device 264, a projector 266, or a control circuit for controlling them. The panel 262 may be configured to be, for example, flexible, transparent, or wearable. The panel 262 and the touch panel 252 may be implemented as one or more modules. According to an embodiment of the present disclosure, the panel 262 may include a pressure sensor (or a force sensor) for measuring the strength of the pressure of a user touch. The pressure sensor may be integrated with the touch panel 252, or configured as one or more sensors separate from the touch panel 252. The hologram device 264 may utilize the interference of light waves to provide a three-dimensional image in empty space. The projector 266 may display an image by projecting light on a screen. The screen may be positioned, for example, inside or outside the electronic device 201.

The interface 270 may include, for example, an HDMI 272, a USB 274, an optical interface 276, or a D-subminiature (D-sub) 278. The interface 270 may be included, for example, in the communication interface 170. Additionally or alternatively, the interface 270 may include, for example, a mobile high-definition link (MHL) interface, an SD/multimedia card (MMC) interface, or an Infrared Data Association (IrDA) interface.

The audio module 280 may, for example, convert a sound to an electrical signal, and vice versa. At least a part of the components of the audio module 280 may be included, for example, in the I/O interface 150. The audio module 280 may process sound information input into, or output from, for example, a speaker 282, a receiver 284, an earphone 286, or the microphone 288. The camera module 291 may capture, for example, still images and a video. According to an embodiment of the present disclosure, the camera module 291 may include one or more image sensors (e.g., a front sensor or a rear sensor), a lens, an ISP, or a flash (e.g., an LED or a xenon lamp). The power management module 295 may manage power of, for example, the electronic device 201. The power management module 295 may include a power management integrated circuit (PMIC), a charger IC, or a battery gauge. The PMIC may use a wired or wireless charging method. The wireless charging may be performed, for example, in a magnetic resonance scheme, a magnetic induction scheme, or an electromagnetic wave scheme, and may further include an additional circuit for wireless charging, for example, a coil loop, a resonance circuit, or a rectifier. The battery gauge may measure, for example, a charge level, a voltage while charging, current, or temperature of the battery 296. The battery 296 may include, for example, a rechargeable battery or a solar battery.

The indicator 297 may indicate specific states of the electronic device 201 or a part of the electronic device 201 (e.g., the processor 210), for example, boot status, message status, or charge status. The electronic device 201 may include, for example, a mobile TV support device (e.g., a GPU) for processing media data compliant with, for example, digital multimedia broadcasting (DMB), digital video broadcasting (DVB), or MediaFLO™. Each of the above-described components of the electronic device may include one or more parts, and the name of the component may vary with the type of the electronic device. According to various embodiments of the present disclosure, some components may be omitted from or added to the electronic device 201, or one entity may be configured by combining a part of the components of the electronic device, to thereby perform the same functions of the components prior to the combining.

Figure 3:
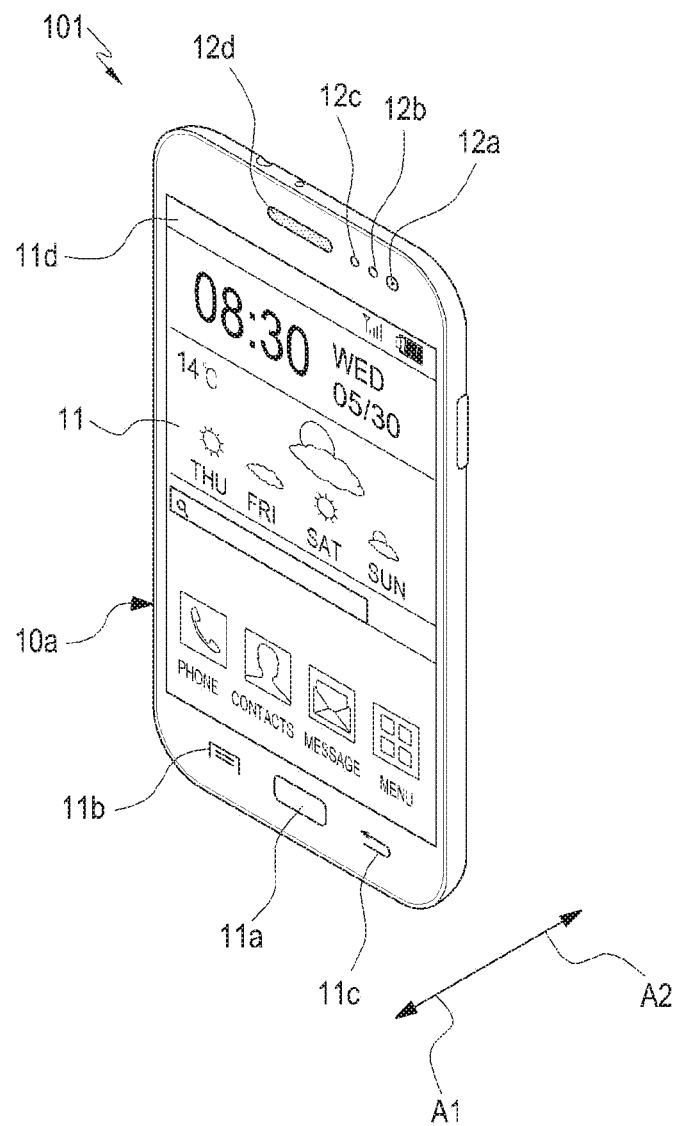
FIG. 3 is a perspective view illustrating the front surface of an electronic device, according to various embodiments of the present disclosure.
Figure 4:
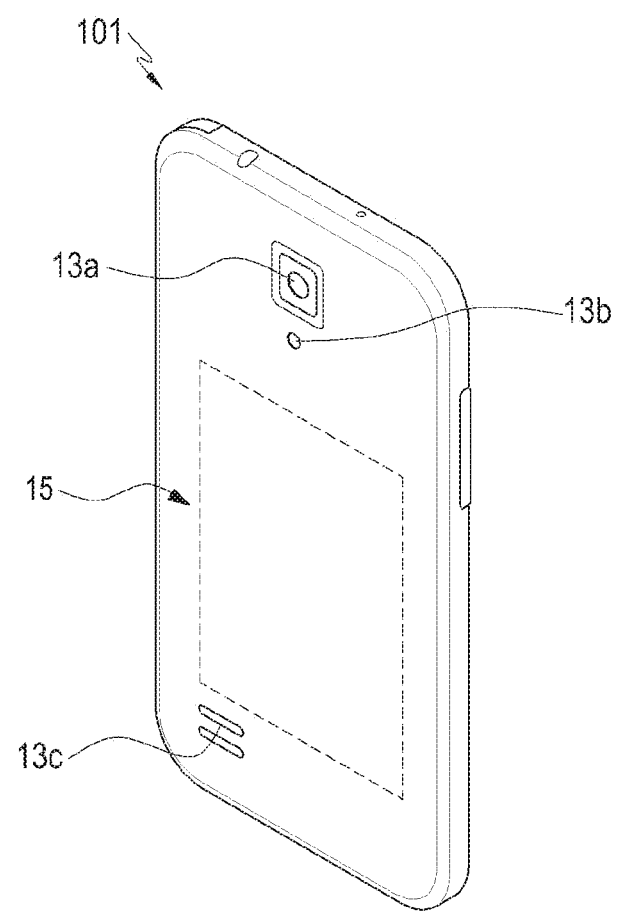
FIG. 4 is a perspective view illustrating the rear surface of an electronic device, according to various embodiments of the present disclosure.

FIG. 3 is a perspective view illustrating the front surface of an electronic device, according to various embodiments of the present disclosure, and FIG. 4 is a perspective view illustrating the rear surface of an electronic device, according to various embodiments of the present disclosure. The electronic device 101 may be a smartphone or a wearable device. Referring to FIG. 3, a touch screen 11 may be disposed at the center of the front surface of the electronic device 101. The touch screen 11 may occupy almost the entirety of the front surface of the electronic device 101. A main home screen is displayed on the touch screen 11. The main home screen is the first screen to be displayed on the touch screen 11, when the electronic device 101 is powered on. In the case where the electronic device 101 has different home screens on a plurality of pages, the main home screen may be the first of the home screens on the plurality of pages. Shortcut icons for executing frequently used applications, a main menu switch key, time, weather, etc. may be displayed on the home screen. The main menu switch key may display a menu screen on the touch screen 11. A status bar 11d may be displayed at the top of the touch screen 11 in order to indicate states such as a battery charged state, a received signal strength, and current time. A home key 11a, a menu button 11b, and a back button 11c may be formed at the bottom of the touch screen 11.

The home key 11a may be used to display the main home screen on the touch screen 11. For example, upon touching of the home key 11a while any home screen other than the main home screen or a menu screen is displayed on the touch screen 11, the main home screen may be displayed on the touch screen 11. In another example, upon touching of the home key 11a during execution of applications on the touch screen 11, the main home screen may be displayed on the touch screen 11. In another example, the home key 11a may also be used to display recently used applications or a task manager on the touch screen 11. The menu button 11b may provide link menus available on the touch screen 11. The link menus may include a widget adding menu, a background changing menu, a search menu, an edit menu, an environment setting menu, a recent task list menu, etc. The back button 11c may be used to display a screen executed previously to a current screen or end the latest used application.

According to various embodiments of the present disclosure, a first camera 12a, an illumination sensor 12b, a proximity sensor 12c, or a speaker 12d may be included at a top end of the front surface of the electronic device 101.

According to various embodiments of the present disclosure, the electronic device 101 may include a housing 10a having a first surface facing in a first direction A1 and a second surface facing in a second direction A2 opposite to the first direction A1. For example, the housing 10a may include a substrate on which an electric element is mounted, inside the housing 10a. The substrate may form a first surface with an electric element mounted thereon, facing in the first direction A1 and a second surface opposite to the first surface, facing in the second direction A2.

Referring to FIG. 4 a second camera 13a, a flash 13b, or a speaker 13c may be included on the rear surface of the electronic device 101. If a battery pack is detachably attached to the electronic device 101, the bottom surface of the electronic device 101 may be a detachable battery cover 15.

Figure 5:
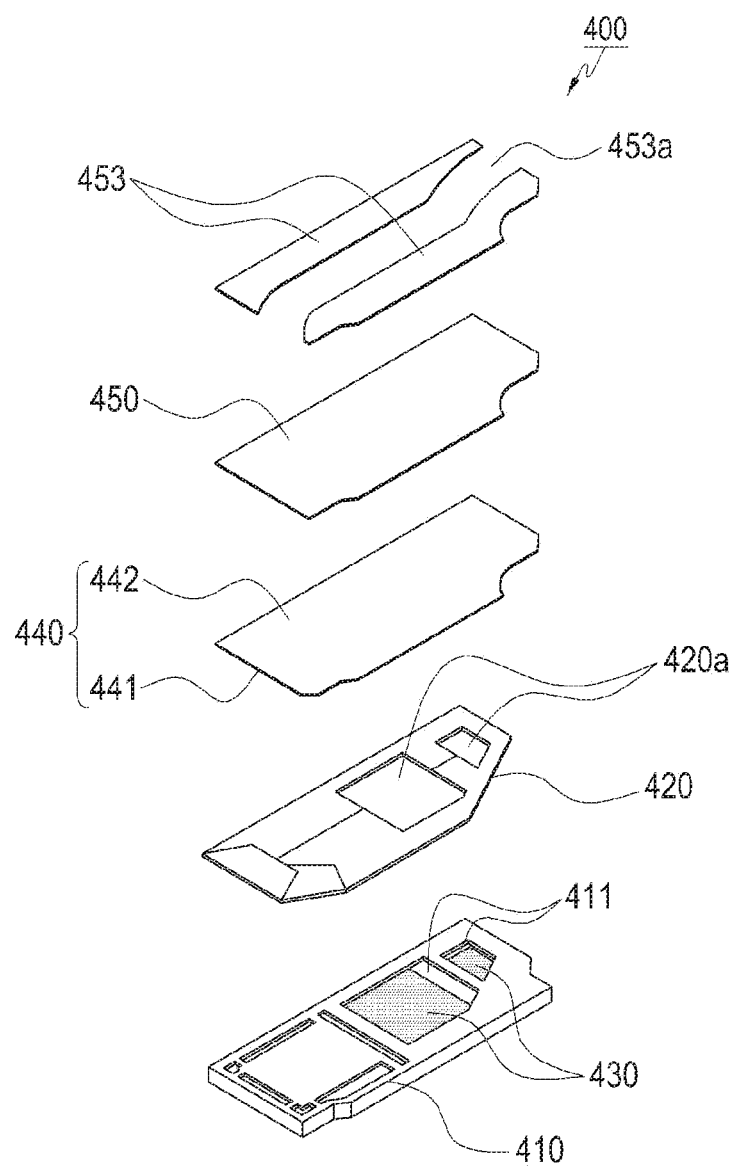
FIG. 5 is an exploded perspective view illustrating the configuration of an electronic device having a shielding member, according to various embodiments of the present disclosure.
Figure 6:
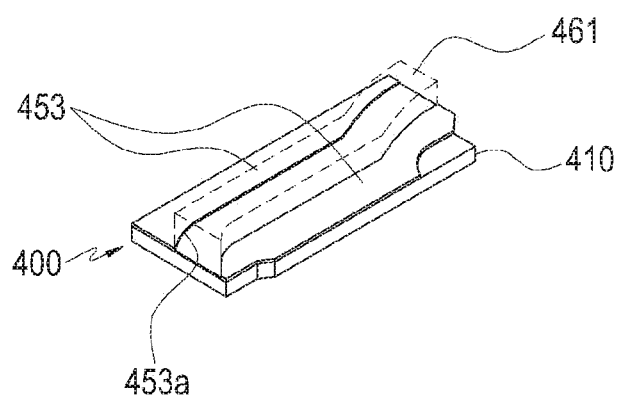
FIG. 6 is a view illustrating an assembled state of an electronic device having a shielding member, according to various embodiments of the present disclosure.

FIG. 5 is an exploded perspective view illustrating the configuration of an electronic device 400 having the shielding member 420, according to various embodiments of the present disclosure, and FIG. 6 is a view illustrating an assembled state of the electronic device having the shielding member 420, according to various embodiments of the present disclosure.

Referring to FIGS. 5 and 6, the electronic device 400 may include a substrate, a shield can 410, the shielding member 420, a heat conductive member 430, and a metal plate 440.

At least one electric element may be mounted on the substrate.

The shield can 410 may surround a part of at least one electric member mounted on the substrate, and include at least one first opening 411 at a portion facing at least one electric member. The shield can 410 may be fixed on the substrate by soldering.

The shielding member 420 may be disposed around a part in which the first opening 411 on the outer surface of the shield can 410, may be so elastic that if the shielding member 420 is pressed by an external force, the shielding member 420 may be compressed, may include at least one second opening to dissipate heat of the heat conductive member 430, and may cover at least a part of the shield can 410 to shield electromagnetic waves of at least one electric element. For example, the shielding member 420 may be electrically connected to the shield can 410, to achieve the shielding performance of electromagnetic waves.

The heat conductive member 430 may be engaged in the shield can 410 by being sequentially engaged with the first opening 411 of the shield can 410 and the second opening of the shielding member 420 so that the heat conductive member 430 may receive heat from at least one electric element, facing a first surface of at least one electric element.

The heat conductive member 430 may be formed of a liquid thermal interface material (TIM).

The heat conductive member 430 may be engaged with a first surface of the metal plate 440, and at least one insulation film may be engaged with a second surface of the metal plate 440 opposite to the first surface. The metal plate 440 may be interposed between the heat conductive member 430 and at least one insulation film 450, thereby transferring the heat of the heat conductive member 430. The metal plate 440 may cover the second opening of the shielding member 420, and may be disposed on the shielding member 420 in this state. To achieve the shielding performance of electromagnetic waves, the metal plate 440 may be electrically connected to the shielding member 420.

A first surface of at least one insulation film 450 may be engaged with the metal plate 440, and a second surface of at least one insulation film 450, opposite to the first surface may be engaged with at least one cooling member. At least one insulation film 450 may transfer the heat received through the metal plate 440 to at least one cooling member. For example, the heat H1 emitted from at least one electric element may be transferred to the heat conductive member 430, and the metal plate 440 may collect the heat and transfer the collected heat to at least one cooling member through the insulation film 450. At least one insulation film 450 may be selectively used depending on the implementation of the electronic device 400.

At least one cooling member may include a first cooling member, and the first cooling member may include a heat pipe. The heat pipe may receive the heat generated from at least one electric element and dissipate the received heat. Any device that is capable of dissipating heat may be used as the first cooling member.

The second cooling member may be engaged with the first cooling member, supporting the first cooling member, and may include a bracket for absorbing and dissipating the heat from the first cooling member. A mounting recess for mounting the first cooling member therein may be formed in the bracket, and the first cooling member may be attached to an adhesive member provided inside the mounting recess. The bracket may be the housing 10a of the electronic device 101. The bracket may include parts provided inside the electronic device 101.

According to an embodiment of the present disclosure, since the shielding member 420 is configured to shield electromagnetic waves, including at least one second opening 420a to dissipate the heat of the heat conductive member 430, the heat H1 is not trapped inside the shield can 410 but is dissipating to the outside. Therefore, the temperature of at least one electric member may be decreased, and the function of shielding the electromagnetic waves of at least one electric element may also be improved. As a consequence, the function of at least one electric element and the performance of the electronic device 101 may be improved.

Referring to FIG. 6, at least one insulation film 450 may include a mounting insulation film 453 engaged with the first cooling member so that the first cooling member may be mounted on the mounting insulation film 453. For example, a mounting hole 453a may be formed in the mounting insulation film 453 so that the first cooling member may be mounted on the mounting insulation film 453. The mounting insulation film 453 may be attached onto the insulation film 450, and the first cooling member 461 may be mounted in the mounting hole 453a, and engaged with the mounting insulation film 453. The mounting insulation film 453 may be selectively used depending on the implementation of the electronic device.

FIG. 7 is a perspective view illustrating the configuration of the shielding member 420, according to various embodiments of the present disclosure.

Referring to FIG. 7, the shielding member 420 may include a body 421 and a shielding film 422. The body 421 may be formed of polyurethane (PU) foam to create a compressive force. As far as it can create a compressive force, any material other than PU foam may be used to create the body 421. For example, the body 421 may be formed of a sponge material.

Figures 7A, 7B, 7C:
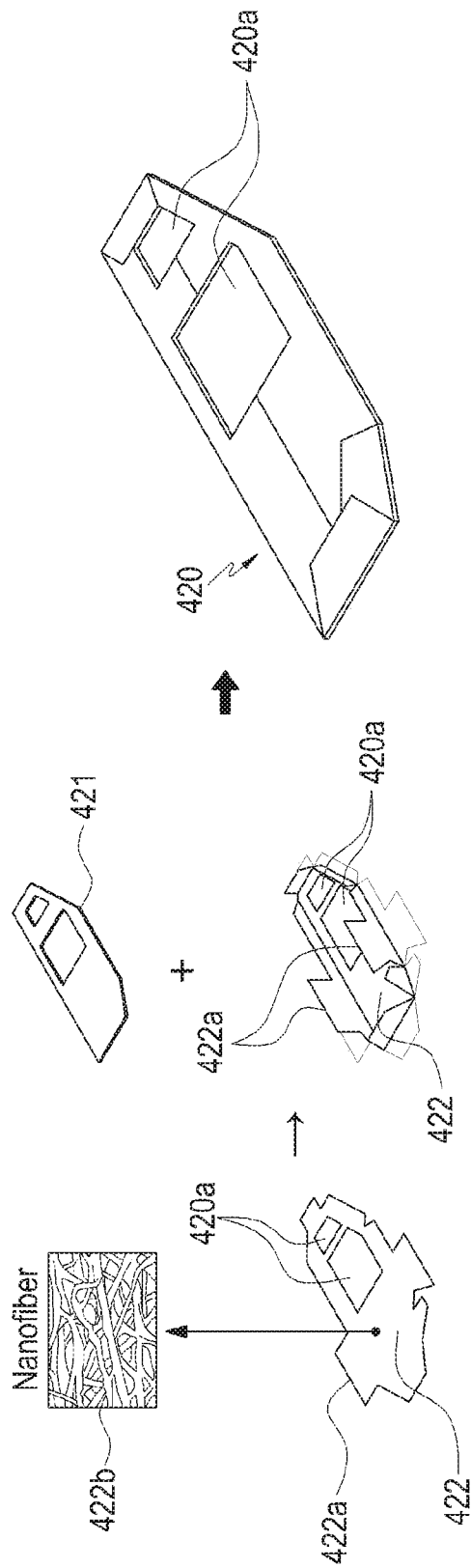
FIGS. 7A, 7B, and 7C are perspective views illustrating the configuration of a shielding member, according to various embodiments of the present disclosure.

As illustrated in FIG. 7A, the shielding film 422 may include a nanofiber film 422b to secure electromagnetic wave-shielding force. The nanofiber film 422b may include fibers, and the fibers may be formed to be thin and long by electro-spinning. These fibers may be plated with copper (Cu), then nickel (Ni), and finally Cu. The nanofiber film 422b may be formed by overlapping these plated fibers a plurality of times. This structure may be referred to as a nano structure.

The shielding film 422 may be formed by cutting the nanofiber film suitably for the shielding member 420. Herein, at least one engagement member 422a may be extended outward from the shielding film 422, for surrounding the exterior of the body 421.

As illustrated in FIG. 7B, an adhesive layer may be formed across the shielding film 422 to attach the body 421 thereon. In this state, the body 421 may be attached onto the adhesive layer formed inside the shielding film 422.

As illustrated in FIG. 7C, at least one engagement member 422a may be folded and fixed onto the body 421, facing the body 421. When the shielding film 422 is folded to be engaged with the body 421, the shielding film 422 may prevent the generation of a crack on a folded part. Accordingly, the shielding film 422 may maintain the electromagnetic wave-shielding force.

Figure 8A:
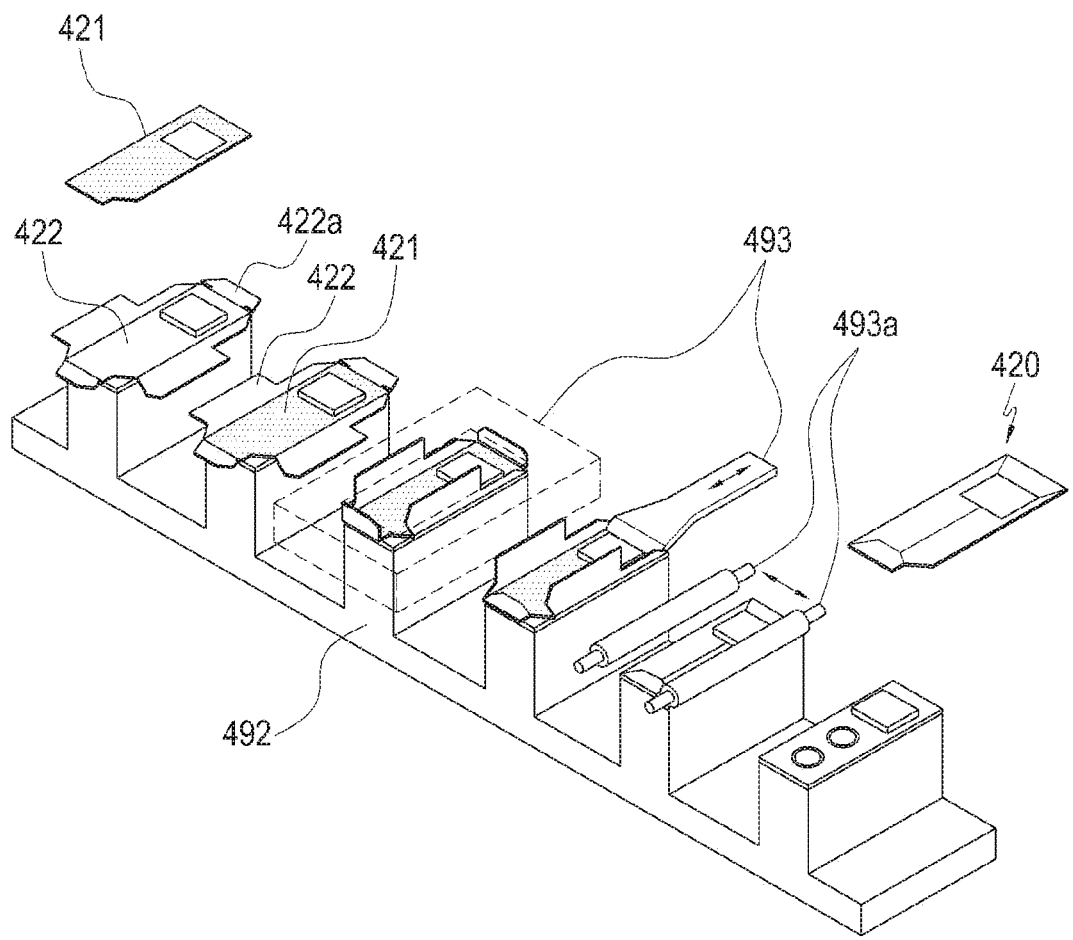
FIG. 8A is a perspective view illustrating a process of fabricating a shielding member, according to various embodiments of the present disclosure.
Figure 8B:
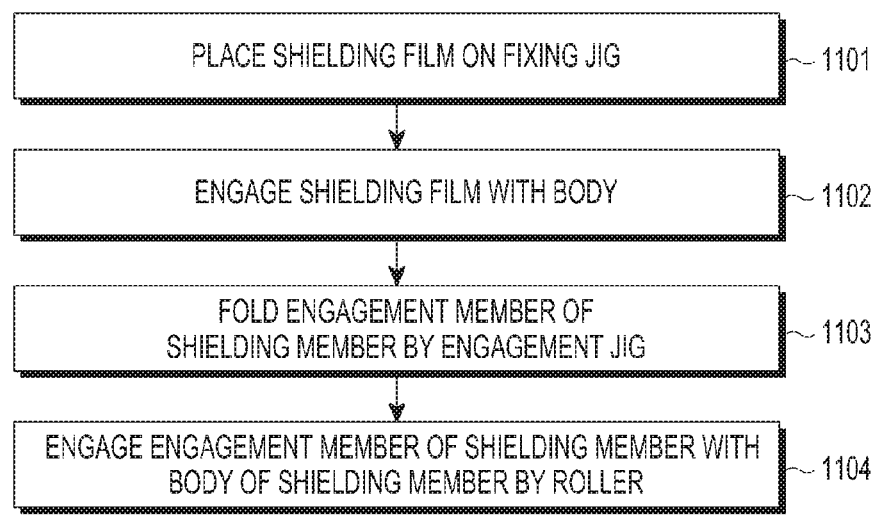
FIG. 8B is a flowchart illustrating a process of fabricating a shielding member, according to various embodiments of the present disclosure.

FIG. 8A is a perspective view illustrating a process of fabricating the shielding member 420, and FIG. 8B is a flowchart illustrating the process of fabricating the shielding member 420, according to various embodiments of the present disclosure.

Referring to FIGS. 8A and 8B, the shielding film 422, which has been cut, may be placed on a fixing jig 492 in step 1101. Herein, an adhesive layer may be formed across the whole shielding film 422. Then, the body 421 may be attached inside the shielding film 422 in step 1102. The engagement member 422a of the shielding film 422 may be primarily folded by at least one engagement jig 493 in step 1103. Subsequently, the engagement member 422a may be secondarily folded and engaged with the body 421 by a roller 493a in step 1104. This completed shielding member 420 may be removed from the fixing jig 492.

Figure 9:
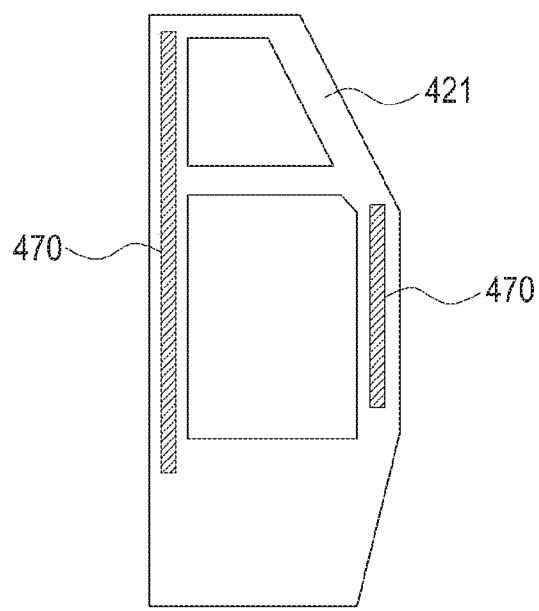
FIG. 9 is a view illustrating an embodiment of a body in a shielding member, according to various embodiments of the present disclosure.

FIG. 9 is a view illustrating an embodiment of the body 421 of the shielding member 420, according to various embodiments of the present disclosure.

Referring to FIG. 9, a magnetic material 470 (e.g., magnetic powder) may be included on one surface of the body 421 formed of PU foam to increase the shielding force of the shielding member 420.

The magnetic material 470 may be formed during molding of the body 421 in order to increase the shielding force. The magnetic material 470 may be formed in a partial area of the body 421. Depending on the fabrication of the body 421, the magnetic material 470 may be formed in a partial area or the total area of the body 421.

The thus-completed shielding member 420 is assembled according to the following process.

Figure 10:
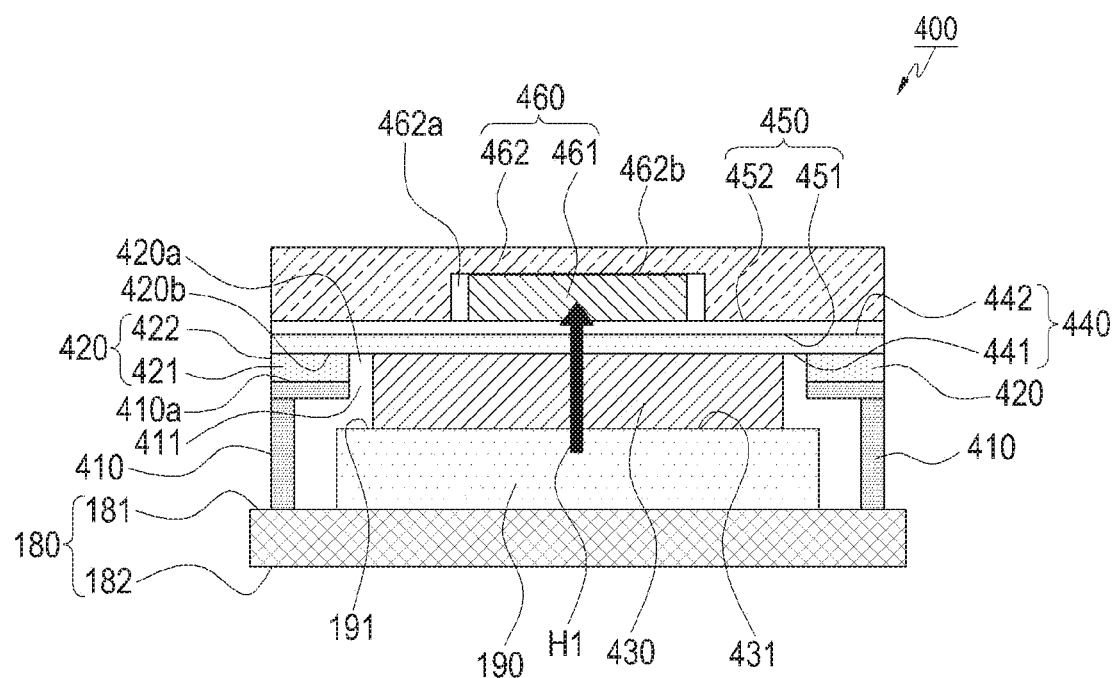
FIG. 10 is a side sectional view illustrating an assembled state of an electronic device having a shielding member, according to various embodiments of the present disclosure.

FIG. 10 is a side sectional view illustrating an assembled state of the electronic device 400 including the shielding member 420, according to various embodiments of the present disclosure.

Referring to FIG. 10, the electronic device 400 may include the substrate 180 have the first surface 181 and the second surface 182, including the at least one electric element 190 mounted thereon. At least one electric element 190 may be disposed on the first surface 181 of the substrate 180. In this state, the shield can 410 of the shielding member 420 may be engaged on the first surface 181 of the substrate 180. At least a part of at least one electric element 190 on the substrate 180 may be surrounded inside the shield can 410. At least one first opening 411 formed on the first surface 410a of the shield can 410 may be formed at a part facing the electric element 190, and dissipate heat of the electric element 190. The shield can 410 may be fixed on the first surface 181 of the substrate 180 by soldering.

The shielding member 420 may be disposed around a part in which the first opening 411 is formed on the first surface (e.g., outer surface) of the shield can 410. The shielding member 420 and the shield can 410 may be formed to be electrically connected to each other.

The shielding member 420 may cover the first surface 410a (e.g., outer surface) of the shield can 410. The second opening 420a facing the first opening 411 of the shield can 410 may be formed on the shielding member 420. If the shielding member 420 is attached onto the first surface 410a of the shield can 410, the first opening 411 of the shield can 410 may face the second opening 420a of the shielding member 420. The metal plate 440 may be mounted over the second opening 420a.

A first surface 431 of the heat conductive member 430 may be engaged with at least a part of the first surface 441 of the metal plate 440. This fabricated metal plate 440 may be engaged with a first surface 420b of the shielding member 420. At the same time, the heat conductive member 430 may be engaged in the first opening 411 and second opening 420a.

In this state, the metal plate 440 may be attached to the first surface 451 of the insulation film 450, and at least one cooling member 460 may be attached to the second surface 452 of the insulation film 450, opposite to the first surface 451. At least one cooling member 460 may include the first cooling member 461 and second cooling member 462. The first cooling member 461 may include a heat pipe, and the second cooling member 462 may include a bracket. The mounting recess 462a may be formed in the bracket, for mounting the first cooling member 461 therein. The first cooling member 461 may first be mounted on the second surface 452 of the insulation film 450 and then the bracket may be engaged outside the first cooling member 461. Herein, since the first cooling member 461 is mounted in the mounting recess 462a of the bracket and the adhesive member 462b is included in the mounting recess 462a, the first cooling member 461 may be attached to the adhesive member 462b, simultaneously with being engaged in the mounting recess 462a. In this state, if the bracket is pressed, the heat conductive member 430, the metal plate 440, the insulation film 450, and the first cooling member 461 and second cooling member 462 may move, pressing down the shielding member 420. Herein, the heat conductive member 430 may be brought into contact with the first surface 191 of the electric element 190, in a face to face manner. Simultaneously with contacting the heat conductive member 430, the electric element 190 may be connected to the metal plate 440 (e.g., heat conductive member), the insulation film 450, and the first cooling member 461.

If power is supplied to and thus operates the electronic device 101 in this state, the electric element 190 may be powered, thus emitting heat H1. The heat H1 of the electric element 190 may be transferred to the heat conductive member 430 penetrating through the first opening 411 of the shield can 410 and the second opening 420a of the shielding member 420, may be collected in the metal plate 440, may pass through the insulation film 450, and then may be transferred to the first cooling member 461, thus being dissipated. The heat H1 of the first cooling member 461 may be dissipated again by the second cooling member 462. Herein, generated electromagnetic waves may be shielded by the shielding member 420.

According to various embodiments of the present disclosure, the heat conductive member 430 may face the first surface 191 of the electric element 190, and include a carbon fiber TIM to receive the heat H1 of the electric element 190. The metal plate 440 may include a Cu plate to transfer the heat H1 of the heat conductive member 430 to the cooling member 460. The heat conductive member 430 is described as, but not limited to, a carbon fiber sheet or a Cu plate, by way of example. As far as it conducts heat, any member may be applied as the heat conductive member 430 and the metal plate 440. The carbon fiber TIM may be any of a liquid TIM and/or a solid TIM. The carbon fiber TIM may be a solid TIM.

To increase heat conductivity, a plurality of conductive particles may be included in the carbon fiber sheet. The plurality of conductive particles may be bar-type conductive particles. These conductive particles may be connected to one another, each erecting upright. Since each of the conductive particles arranged in this manner may conduct heat in the upright direction, heat conduction efficiency may be high and the heat resistance may be low.

Figure 11:
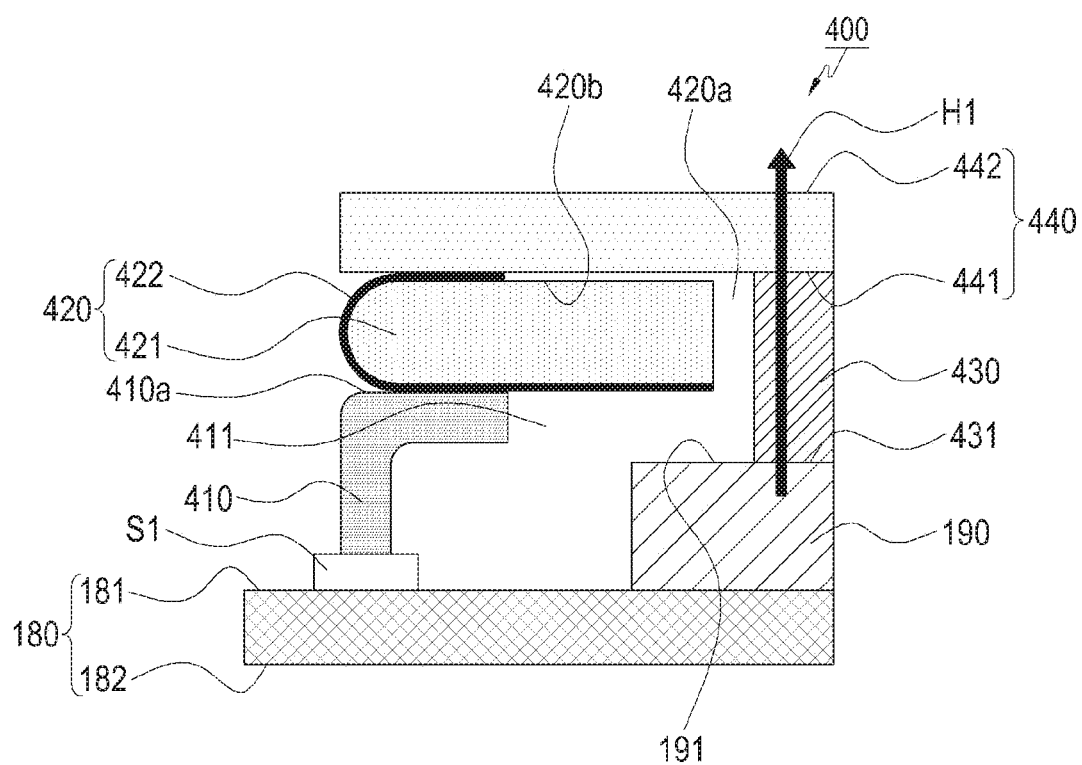
FIG. 11 is an enlarged side sectional view illustrating an engaged state of an electronic device having a shielding member, according to various embodiments of the present disclosure.

FIG. 11 is an enlarged side sectional view illustrating an engaged state of an electronic device having a shielding member, according to various embodiments of the present disclosure.

Referring to FIG. 11, the shield can 410 which surrounds at least a part of at least one electric element 190 mounted on the substrate 180 and includes at least one first opening 411 may be disposed in the electronic device 400. The shield can 410 may be fixed onto the substrate 180 by soldering S1. The shielding member 420 including at least one second opening 420a may be mounted on the first surface 410a of the shield can 410. The metal plate 440 may be mounted on the first surface 420b of the shielding member 420. The heat conductive member 430 may be included on the first surface 441 of at least one metal plate 440. The metal plate 440 may cover the first surface 420b of the shielding member 420.

The shielding member 420 may include the body 421 formed of PU foam and the shielding film 422 engaged with the body 421, surrounding the exterior of the body 421. The shielding film 422 may include a nanofiber film.

As the shielding film 422 is engaged with the body 421, surrounding the exterior of the body 421, the shielding member 420 may prevent leakage of electromagnetic waves of the electric element 190 generated inside the shield can 410 to the outside of the shielding member 420. Therefore, the electromagnetic wave-shielding function of the shielding member 420 may be improved.

Figure 12:
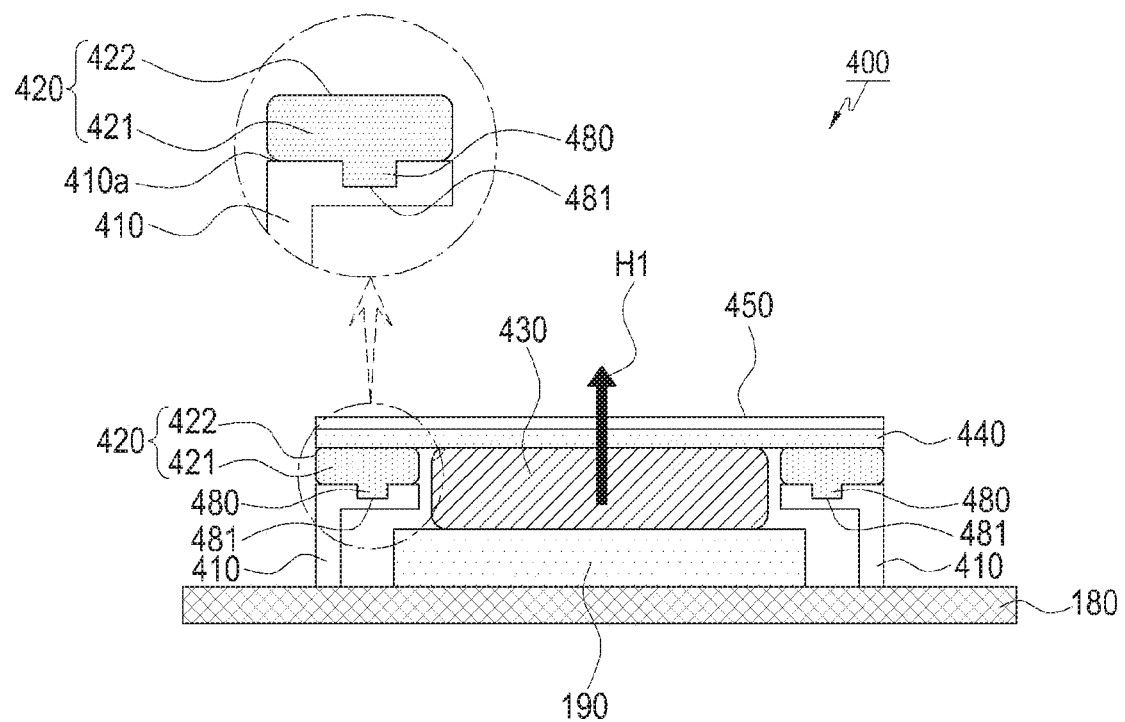
FIG. 12 is a side sectional view illustrating an electronic device having a shielding member, according to various embodiments of the present disclosure.

FIG. 12 is a side sectional view illustrating an electronic device having a shielding member 420, according to various embodiments of the present disclosure.

Referring to FIG. 12, the shielding member 420 may include at least one engagement protrusion 480 which is engaged with at least one engagement groove 481 formed in the shield can 410.

When the shielding member 420 is mounted on the first surface 410a of the shield can 410, at least one engagement protrusion 480 formed on the shielding member 420 may be inserted into at least one engagement groove 481 formed on the first surface 410a of the shield can 410.

At least one engagement groove 481 and at least one engagement protrusion 480 may be formed on engagement surfaces of the shield can 410 and the shielding member 420. At least one engagement groove 481 may be formed on the engagement surface of the shield can 410, and at least one engagement protrusion 480 may be formed on the engagement surface of the shielding member 420, to be engaged with at least one engagement groove 481.

According to an embodiment of the present disclosure, the engagement protrusion 480 and the engagement groove 481 may be exchanged in position between the shielding member 420 and the shield can 410. For example, instead of the engagement protrusion 480, the engagement groove 481 may be formed in the shielding member 420, whereas instead of the engagement groove 481, the engagement protrusion 480 may be formed in the shield can 410. Therefore, when the shielding member 420 is mounted on the first surface 410a of the shield can 410, the engagement protrusion 480 formed on the first surface 410a of the shield can 410 may be inserted into the engagement groove 481 formed on the shielding member 420.

Therefore, the shielding member 420 may be accurately fixed on the shield can 410 by means of the engagement protrusion 480 and the engagement groove 481.

Figure 13:
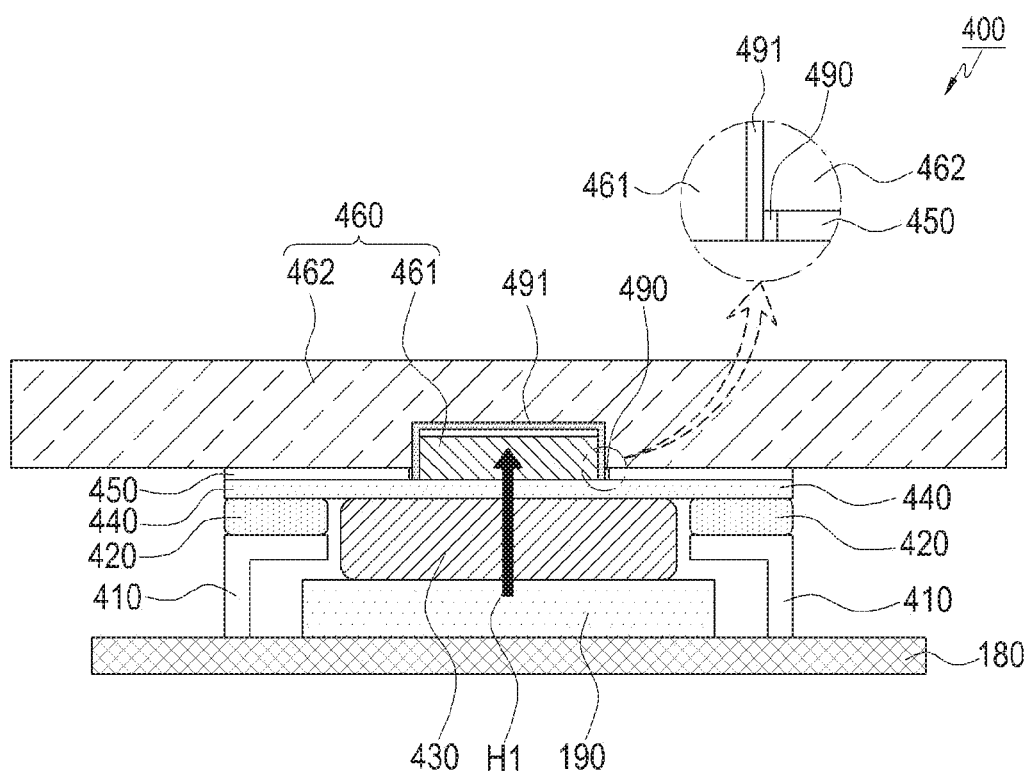
FIG. 13 is a side sectional view illustrating an insulation film in an electronic device having a shielding member, according to various embodiments of the present disclosure.

FIG. 13 is a side sectional view illustrating an insulation film 450 in the electronic device 400 having the shielding member 420, according to various embodiments of the present disclosure.

Referring to FIG. 13, the insulation film 450 may include an insertion through hole 490 for inserting the first cooling member 461 therethrough to connect the metal plate 440 directly to the first cooling member 461. In this state, an insulation coating 491 may be applied onto the exterior of the first cooling member 461 to prevent electric shock from the electric element 190 caused by electricity introduced from the outside of the shielding member 420. The insertion through hole 490 may be formed by cutting a center portion of the insulation film 450, and the heat pipe being the first cooling member 461 may be provided in the insertion through hole 490. The heat pipe may directly face the metal plate 440 through the insertion through hole 490. An inner first surface of the heat pipe may directly face the metal plate 440, and the insulation coating 491 may be applied on an outer second surface of the heat pipe. The second cooling member 462 may be engaged on the exterior of the insulation film 450, and include a bracket. The insulation film 450 may prevent electric shock of the electric element 190 by preventing introduction of electricity from the outside of the shielding member 420 through the second cooling member 462.

Therefore, the heat H1 of the electric element 190 may be transferred to the heat conductive member 430, and then to the heat pipe through the metal plate 440, thus being dissipated.

In this manner, since the heat H1 of the electric element 190 is transferred directly to the heat pipe without passing through the insulation film 450 and then dissipated, the shielding member 420 may improve the heat dissipation function, thereby increasing the cooling efficiency of the electric element 190.

Figure 14:
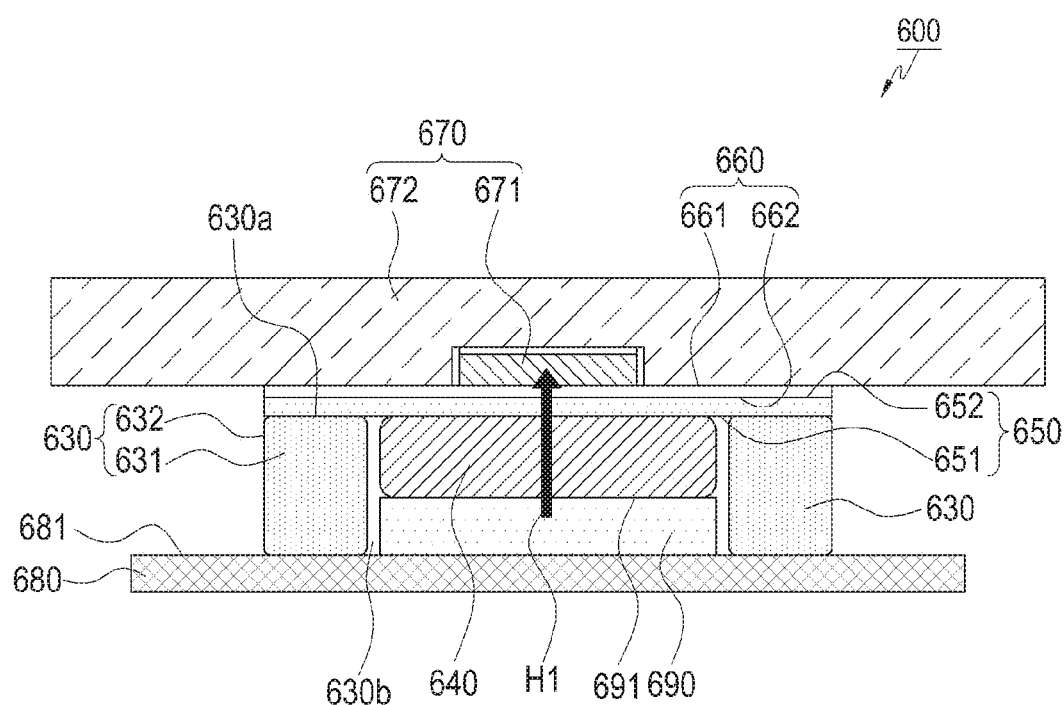
FIG. 14 is a side sectional view illustrating an electronic device having a shielding member, according to various embodiments of the present disclosure.

FIG. 14 is a side sectional view illustrating an electronic device 600 having the shielding member 630, according to other various embodiments of the present disclosure.

Referring to FIG. 14, the electronic device 600 may include a substrate 680, the shielding member 630, a heat conductive member 640, a metal plate 650, and at least one insulation film 660.

At least one electric element 690 may be mounted on a first surface 681 of the substrate 680.

The shielding member 630 may cover the first surface 681 of the substrate 680, may surround the side surface of the electric element 690, may be compressed upon being pressed, and may include at least one opening 630b to dissipate heat H1 of the electric element 690. A shielding film 632 may surround the exterior of the shielding member 630, for shielding. The shielding member 630 may include a body 631 formed of PU foam, and the shielding film 632 surrounding the exterior of the body 631. The shielding film 632 may include a nanofiber film.

According to an embodiment of the present disclosure, the shielding member 630 may be mounted on the first surface 681 of the substrate 680, without a shield can, and may surround at least a part of at least one electric element 690 on the substrate 680. In this state, the metal plate 650 may cover a first surface of the shielding member 630. The shielding member 630 may serve as the shield can.

The heat conductive member 640 may be included on a first surface 651 of the metal plate 650, and at least one insulation film 660 may be included on a second surface 652 of the metal plate 650 opposite to the first surface 651. At least one cooling member 670 may be included on a second surface 662 of the insulation film 660 opposite to a first surface 661 of the insulation film 660. In this state, the insulation film 660 may transfer the heat H1 which has passed through the metal plate 650 to the cooling member 670.

In this state, the first surface of the heat conductive member 640 may be engaged with at least a part of the first surface 651 of the metal plate 650, and the insulation film 660 may be engaged with the second surface 652 of the metal plate 650. The metal plate 650 which has been fabricated in this manner may cover the first surface 630a of the shielding member 630, and at the same time, the heat conductive member 640 may be engaged in the opening 630b of the shielding member 630.

In this state, the metal plate 650 may be attached onto the first surface 661 of the insulation film 660, and at least one cooling member 670 may be attached onto the second surface 662 opposite to the first surface 661 of the insulation film 660. At least one cooling member 670 may include first cooling member 671 and second cooling member 672, the first cooling member 671 may include a heat pipe, and the second cooling member 672 may include a bracket. If the bracket is pressed, the shielding member 630 formed of the PU foam may be compressed, moving the heat conductive member 640 and the metal plate 650 together. The heat conductive member 640 may be brought into contact with the first surface 691 of the electric element 690, in a face to face manner. Simultaneously with contacting the heat conductive member 640, the electric element 690 may be connected to the metal plate 650, the insulation film 660, and the first cooling member 671.

In this state, when power is supplied to and thus operates the electronic device 600, at least one electric element 690 is powered, thus emitting heat H1.

The heat of the electric element 690 may be transferred to the heat conductive member 640 engaged in the opening 630b of the shielding member 630, may pass through the metal plate 650 and the insulation film 660, and then may be transferred to the first cooling member 671, thus being dissipated. The heat H1 in the first cooling member 671 may be dissipated again by the second cooling member 672. Herein, generated electromagnetic waves may be shielded by the shielding member 630.

As the electronic device 600 is so configured that at least a part of at least one electric element 690 on the substrate 680 may be surrounded or covered without a shield can in this manner, the shielding member 630 may serve as the shield can on the substrate 680, thereby simplifying an assembly process due to reduction of the number of parts in the electronic device 600, facilitating dissipation of the heat H1 of the electric element 690, and improving the function of shielding electromagnetic waves to the electric element 690. As a consequence, malfunction of the electronic device 600 may be prevented, and the performance of the electronic device 600 may be increased.

Figure 15:
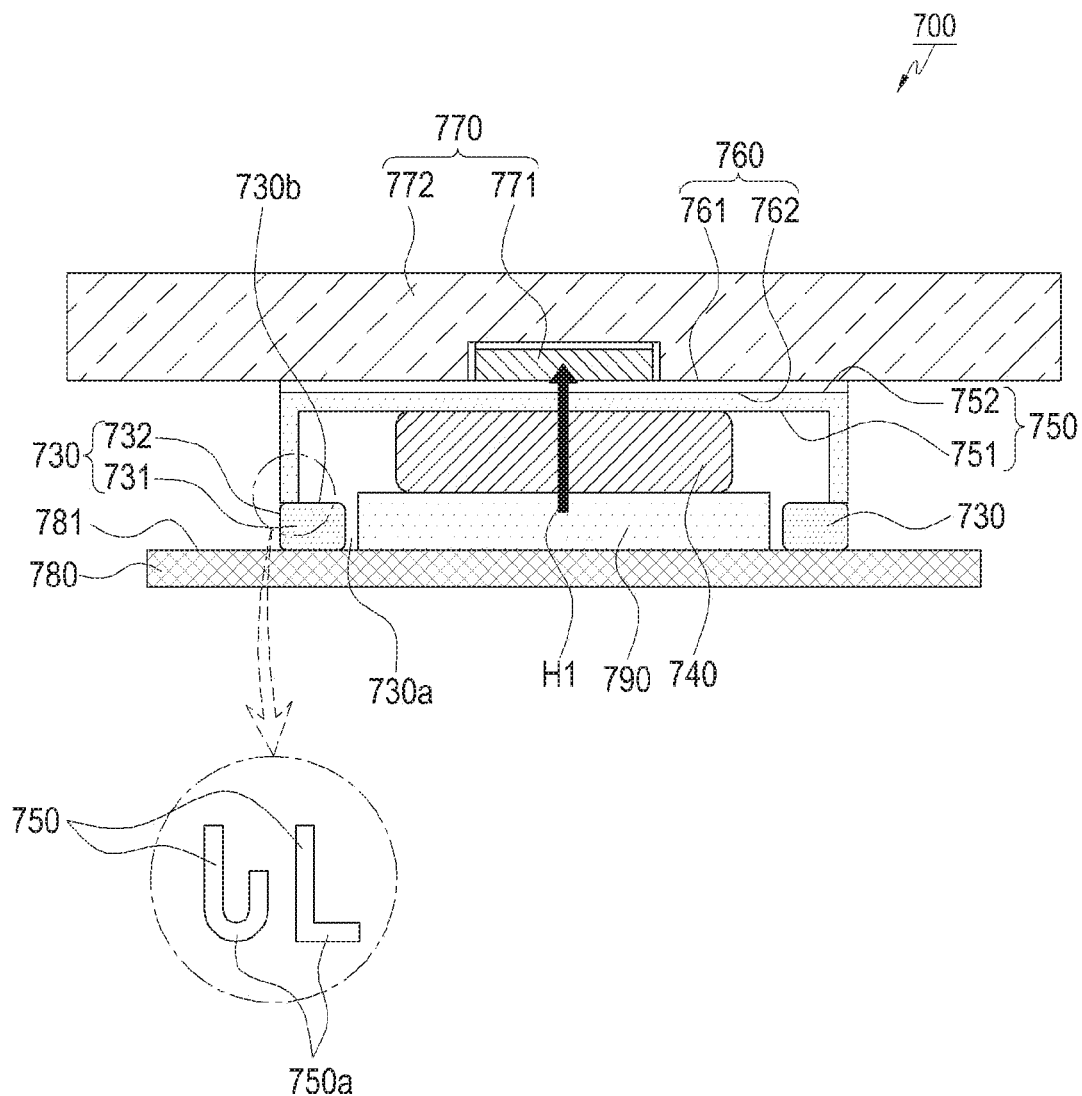
FIG. 15 is a side sectional view illustrating an electronic device having a shielding member, according to various embodiments of the present disclosure.

FIG. 15 is a side sectional view illustrating the electronic device 700 having the shielding member 730, according to other various embodiments of the present disclosure.

Referring to FIG. 15, the electronic device 700 may include a substrate 780, the shielding member 730, a heat conductive member 740, a metal plate 750, and at least one insulation film 760.

At least one electric element 790 may be mounted on a first surface 781 of the substrate 780.

The shielding member 730 may be included on the first surface 781 of the substrate 780, may surround the side surface of at least one electric element 790, may be compressed upon being pressed, and may include at least one opening 730a for discharging heat H1 of the electric element 790. A shielding film 732 may surround the exterior of the shielding member 730, for shielding.

According to an embodiment of the present disclosure, the shielding member 730 may be mounted on the first surface 781 of the substrate 780, without a shield can, and surround at least a part of at least one electric element 790 on the substrate 780. In this state, the metal plate 750 may cover a first surface 730b of the shielding member 730. The shielding member 730 may serve as the shield can. The shielding member 730 may include a body 731 formed of PU foam, and the shielding film 732 surrounding the body 731. The shielding film 732 may include a nanofiber film.

The heat conductive member 740 may be included inside a first surface 751 of the metal plate 750, and at least one insulation film 760 may be included on a second surface 752 opposite to the first surface 751 of the metal plate 750. The metal plate 750 may be included on a first surface 761 of the insulation film 760, and at least one cooling member 770 may be included on a second surface 762 opposite of the first surface 761 of the insulation film 760. In this state, the insulation film 760 may transfer the heat H1 which has passed through the metal plate 750 to at least one cooling member 770.

The metal plate 750 may be shaped into an "n" like shape. As far as the heat conductive member 740 can be mounted inside the metal plate 750, any shape is available for the metal plate 750. If the metal plate 750 is formed into a cylindrical housing in which a space for accommodating the heat conductive member 740 may be formed, the metal plate 750 is applicable to various embodiments of the present disclosure.

Both ends 750a of the metal plate 750 may be fixed on the first surface 730b of the shielding member 730, in a face to face manner. The ends 750a of the metal plate 750 may be shaped into a "U" or an "L" like shape. Since the ends 750a of the metal plate 750 are contact surfaces which contact the first surface 730b of the shielding member 730, the contact surfaces may be formed into various shapes to facilitate the contact.

In this state, the first surface of the heat conductive member 740 may be attached onto at least a part of the first surface 751 of the metal plate 750, and at least one insulation film 760 may be attached onto the second surface 752 of the metal plate 750. Both ends 750a of the metal plate 750, fabricated in this manner, may be brought into contact with the first surface 730b of the shielding member 730, and at the same time, the first surface of the electric element 790 may be brought into contact with the first surface of the heat conductive member 740. In this state, the metal plate 750 may be attached onto the first surface 761 of the insulation film 760, and at least one cooling member 770 may be attached onto the second surface 762 opposite to the first surface 761 of the insulation film 760. At least one cooling member 770 may include first and second cooling members 771 and 772, the first cooling member 771 may include a heat pipe, and the second cooling member 772 may include a bracket. In this state, if the bracket is pressed, the shielding member 730 formed of the PU foam may be compressed, moving the heat conductive member 740 and the metal plate 750 together. The heat conductive member 740 may be brought into contact with the first surface of the electric element 790, in a face to face manner. Simultaneously with contacting the heat conductive member 740, the electric element 790 may be connected to the metal plate 750, the insulation film 760, and the first cooling member 771. In this state, when power is supplied to and thus operates the electronic device 700, at least one electric element 790 is powered, thus emitting heat H1.

The heat H1 of the electric element 790 may be transferred to the heat conductive member 740 through the opening 730a of the shielding member 730, may pass through the metal plate 750 and the insulation film 760, and then may be transferred to the first cooling member 771, thus being dissipated. The heat H1 in the first cooling member 771 may be dissipated again by the second cooling member 772. Herein, generated electromagnetic waves may be shielded by the shielding member 730.

As the electronic device 700 is so configured as to include the shielding member 730 surrounding the side surface of at least one electric element 790 on the substrate 780, and the metal plate 750 having the heat conductive member 740 mounted therein, the shielding member 730 and the metal plate 750 may serve as the shield can, thereby simplifying an assembly process due to reduction of the number of parts in the electronic device 700, facilitating dissipation of the heat H1 of the electric element 790, and improving the function of shielding electromagnetic waves to the electric element 790. As a consequence, malfunction of the electronic device 700 may be prevented, and the performance of the electronic device 700 may be increased.

Figure 16:
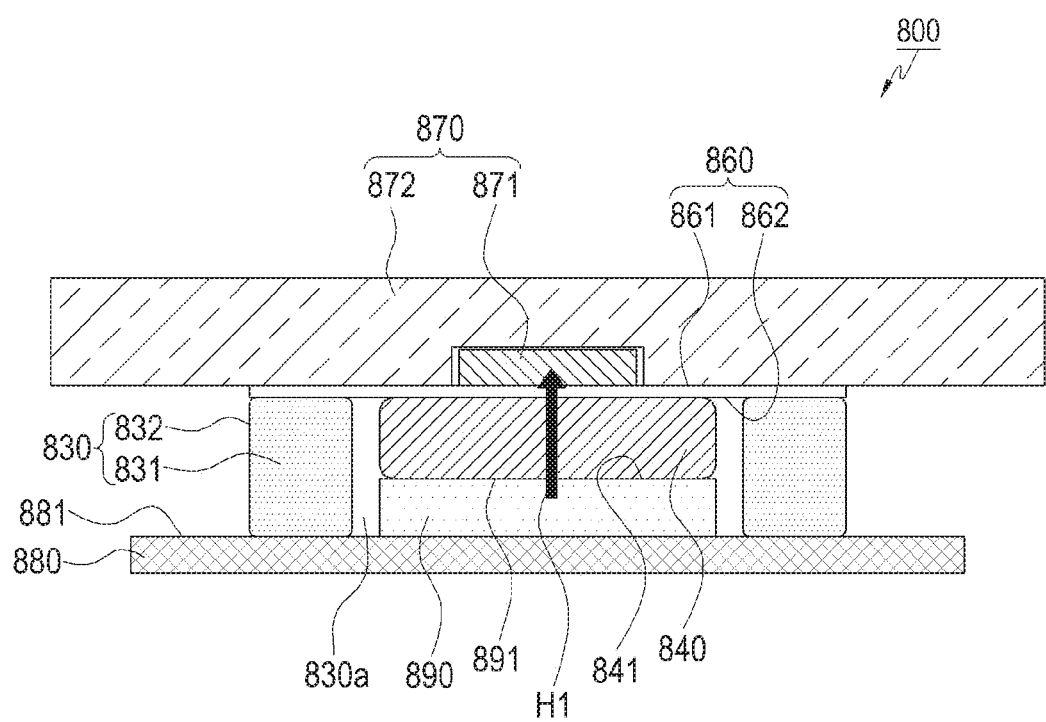
FIG. 16 is a side sectional view illustrating an electronic device having a shielding member, according to various embodiments of the present disclosure.

FIG. 16 is a side sectional view illustrating the electronic device 800 having the shielding member 830, according to various embodiments of the present disclosure.

Referring to FIG. 16, the electronic device 800 may include a substrate 880, the shielding member 830, a heat conductive member 840, and at least one insulation film 860.

At least one electric element 890 may be mounted on a first surface 881 of the substrate 880.

The shielding member 830 may be included on the first surface 881 of the substrate 880, may surround the side surfaces of at least one electric element 890 and the heat conductive member 840, may be compressed upon being pressed, and include at least one opening 830a for dissipating heat H1 of the electric element 890. A shielding film 832 may surround the exterior of the shielding member 830, for shielding. The shielding member 830 may include a body 831 formed of PU foam, and the shielding film 832 surrounding the body 831. The shielding film 832 may include a nanofiber film.

According to an embodiment of the present disclosure, the shielding member 830 may be mounted on the first surface 881 of the substrate 880, without a shield can and a metal plate, and surround at least a part of at least one electric element 890 on the substrate 880. In this state, the insulation film 860 may cover a first surface of the shielding member 830. The shielding member 830 may serve as the shield can and the metal plate.

The heat conductive member 840 may be included on a first surface 861 of the insulation film 860, and at least one cooling member 870 may be included on a second surface 862 opposite to the first surface 861 of the insulation film 860. In this state, the insulation film 860 may transfer the heat H1 which has passed through the heat conductive member 840 to at least one cooling member 870.

In this state, the exterior of the first surface 861 of the insulation film 860 may be attached onto the first surface of the shielding member 830, and the heat conductive member 840 may be attached inside the first surface 861 of the insulation film 860. Herein, the first surface 841 of the heat conductive member 840 may be brought into contact with the first surface 891 of at least one electric element 890.

In this state, at least one cooling member 870 included on the second surface 862 of the insulation film 860 may include first cooling member 871 and second cooling member 872, the first cooling member 871 may include a heat pipe, and the second cooling member 872 may include a bracket. If the bracket is pressed, the shielding member 830 formed of the PU foam may be compressed, moving the heat conductive member 840. The heat conductive member 840 may be brought into contact with the first surface 891 of the electric element 890, in a face to face manner. Simultaneously with contacting the heat conductive member 840, the electric element 890 may be connected to the insulation film 860 and the first cooling member 871. In this state, when power is supplied to and thus operates the electronic device 800, at least one electric element 890 is powered, thus emitting heat H1.

The heat H1 of the electric element 890 may be transferred to the heat conductive member 840 included inside the shielding member 830, may pass through the insulation film 860, and then may be transferred to the first cooling member 871, thus being dissipated. The heat H1 in the first cooling member 871 may be dissipated again by the second cooling member 872. Herein, generated electromagnetic waves may be shielded by the shielding member 830.

As the electronic device 800 is so configured as to surround the side surfaces of at least one electric element 890 on the substrate 880 and the heat conductive member 840, without a shield can and a metal plate, and cover the shielding member 830 by the insulation film 860, the shielding member 830 may serve as the shield can and transfer the heat of the electric element 890 to the cooling member 870 without using the metal plate, thereby improving a cooling function for a product, simplifying an assembly process and shortening an assembly process time due to reduction of the number of parts in the electronic device 800, facilitating dissipation of the heat H1 of the electric element 890, and improving the function of shielding electromagnetic waves to the electric element 890. As a consequence, malfunction of the electronic device 800 may be prevented, and the performance of the electronic device 800 may be increased.

According to various embodiments of the present disclosure, an electronic device may include a substrate including an electric element mounted thereon, a shield can mounted on the electric element and including an opening formed at a part facing the electric element, a shielding member mounted around a part in which the opening is formed on an outer surface of the shield can, and electrically connected to the shield can, a metal plate mounted on the shielding member, with the opening covered, and electrically connected to the shielding member, and a heat conductive member mounted in the opening and interposed between the electric element and the metal plate in contact with the electric element and the metal plate.

As the shielding member may be configured to be elastic and to be compressed by an external force, and contact the electric element, the shielding member may dissipate heat or shield electromagnetic waves.

According to various embodiments of the present disclosure, an electronic device may include a substrate including an electric element mounted thereon, a shield can mounted on the electric element and including a first opening formed at a part facing the electric element, a shielding member mounted around a part in which the first opening is formed on a first surface of the shield can, and including a second opening electrically connected to the shield can, a metal plate mounted on the shielding member, with the first opening covered, and electrically connected to the shielding member, and a heat conductive member mounted in the first opening and interposed between the electric element and the metal plate in contact with the electric element and the metal plate.

The heat conductive member may include a carbon fiber sheet, and the metal plate may include a Cu plate.

The electronic device may further include at least one insulation film, the metal plate may be included on a first surface of the at least one insulation film, and at least one cooling member may be included on a second surface of the at least one insulation film opposite to the first surface of the at least one insulation film.

The insulation film may include a mounting insulation film for mounting a first cooling member thereon in engagement with the first cooling member.

The shielding member may include a body formed of PU foam, and a shielding film surrounding the body and including a nanofiber film.

The heat conductive member may include at least one of a liquid TIM and a solid TIM.

The at least one cooling member may include a first cooling member and a second cooling member, the first cooling member may include a heat pipe engaged with an insulation film included in the electronic device, for receiving heat generated from the electric element through the metal plate and the heat conductive member, and cooling the received heat, and the second cooling member may include a bracket engaged with the first cooling member, while being supported by the first cooling member, for absorbing and cooling the heat of the first cooling member.

The body may include a magnetic material to increase a shielding force.

The shielding member may further include at least one engagement protrusion to be engaged with at least one protrusion groove formed in the shield can.

The insulation film may include an insertion through hole for allowing the first cooling member to be inserted therethrough, to connect the metal plate directly to the first cooling member, and an insulation coating may be applied on an exterior of the first cooling member.

According to various embodiments of the present disclosure, an electronic device may include a shielding member surrounding a side surface of the electric element, and including at least one opening, and a shielding film around an exterior of the shielding member, for shielding, a metal plate having a first surface on which a heat conductive member inserted through the openings and receiving heat of the electric element is mounted, and a second surface opposite to the first surface, on which at least one insulation film is mounted, and the at least one insulation film having a first surface on which the metal plate is mounted, and a second surface opposite to the first surface, on which at least one cooling member is mounted, for transferring heat passed through the metal plate to the at least one cooling member.

According to various embodiments of the present disclosure, an electronic device may include a shielding member surrounding a side surface of the electric element, and including a shielding film around an exterior of the shielding member, for shielding, a metal plate including a first surface on which a heat conductive member receiving heat of the electric element is mounted, and a second surface opposite to the first surface, on which at least one insulation film is mounted, and covering the shielding member and the electric element, and the at least one insulation film including a first surface on which the metal plate is mounted, and a second surface opposite to the first surface, on which at least one cooling member is mounted, for transferring heat passed through the metal plate to the at least one cooling member.

An overall shape of the metal plate may be an "n" shape, and each of both ends of the metal plate may be shaped into one of a "U" and an "L" shape.

According to various embodiments of the present disclosure, an electronic device may include a shielding member surrounding a side surface of the electric element, and including a shielding film around an exterior of the shielding member, for shielding, and at least one insulation film having a first surface on which a heat conductive member receiving heat of the electric element is mounted, and a second surface opposite to the first surface, on which at least one cooling member is mounted, and covering the shielding member, for transferring heat passed through the heat conductive member to the at least one cooling member.

Figure 17:
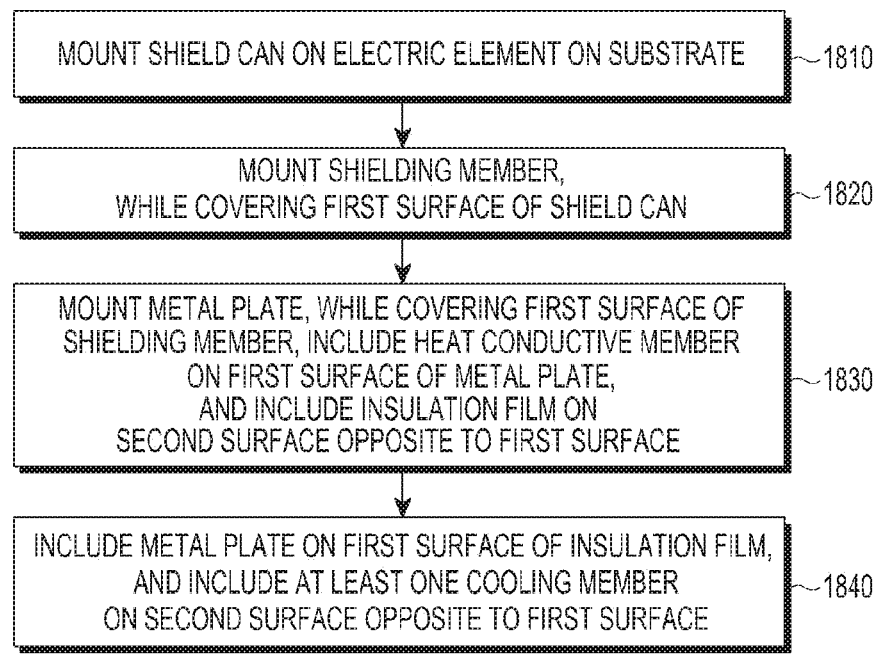
FIG. 17 is a flowchart illustrating a method for assembling an electronic device having a shielding member, according to various embodiments of the present disclosure.

FIG. 17 is a flowchart illustrating a method for assembling the electronic device 400 including the shielding member 420, according to various embodiments of the present disclosure.

Referring to FIG. 17, a substrate 180 including an electric element 190 mounted thereon may be included.

The shield can 410 which surrounds at least a part of at least one electric element 190 and includes at least one first opening 411 may be mounted on the substrate 180 in step 1810.

The shielding member 420 which covers the first surface 410*a* of the shield can 410, is compressed upon being pressed by an external force, and includes at least one second opening 420*a* to dissipate heat H1 of at least one electric element 190 may be disposed, and the shielding film 422 may surround the exterior of the shielding member 420, for shielding.

For the shielding member 420, the shielding film 422 may be fabricated by cutting a nanofiber film 422*b*, the cut shielding film 422 may be placed on a fixing jig 492, the body 421 formed of PU foam may be engaged inside the shielding film 422, and at least one engagement member 422*a* protruding from the exterior of the shielding member 420 may be folded and surround the body 421 by means of an engagement jig 493 and a roller 493*a*.

The thus-assembled shielding member 420 may be mounted on the first surface 410*a* of the shield can 410 in step 1820.

In this state, the metal plate 440 may be engaged with the first surface 420*b* of the shielding member 420, the heat conductive member 430 may be engaged with the first surface 441 of at least one metal plate 440, and at least one insulation film 450 may be engaged with the second surface 442 of at least one metal plate 440 opposite to the first surface 441. The metal plate 440 covers the first surface 420*b* of the shielding member 420. At the same time, as the heat conductive member 430 is engaged in the first opening 411 and second opening 420*a*, the heat conductive member 430 may face the first surface 191 of the electric element 190 in step 1830.

When at least one cooling member 460 is pressed, the shielding member 420 may be compressed, moving the heat conductive member 430 and thus making the heat conductive member 430 face the electric element 190. Since the shielding member 420 includes the body 421 formed of PU foam such as sponge, when the cooling member 460 is pressed down, the shielding member 420 is compressed, moving the heat conductive member 430. Herein, the engagement surface of the heat conductive member 430 may face the first surface 191 of the electric element 190. Thus, lift-up of the heat conductive member 430 and the electric element 190 may be prevented.

When the shielding member 420 is compressed in this manner, the body 421 formed of PU foam is compressed and the shielding film 422 surrounds the exterior of the PU foam, for shielding. Thus, electromagnetic waves generated from the electric element 190 may be shielded by the shielding film 422.

The metal plate 440 may be engaged with the first surface 451 of the insulation film 450, and at least one cooling member 460 may be engaged with the second surface 452 of the insulation film 450 opposite to the first surface 451. The insulation film 450 may transfer heat H1 to the heat conductive member 430 to the cooling member 460 through the metal plate 440. The cooling member 460 may include the first cooling member 461 and second cooling members 462 in step 1840.

As described above, heat H1 generated from the electric element 190 may be transferred to the heat conductive member 430, pass through the metal plate 440 and the insulation film 450, and transferred to the heat pipe being the first cooling member 461, thus being dissipated. The heat which has not been dissipated in the first cooling member 461 may be transferred to the bracket being the second cooling member 462 and then dissipated.

According to various embodiments of the present disclosure, a method for assembling an electronic device may include including a substrate including an electric element mounted thereon, disposing a shield can including at least one first opening at a part facing the electric element on the substrate, disposing a shielding member to cover a first surface of the shield can, the shielding member being compressed when being pressed, and including at least one second opening for discharging heat of the electric element, and a shielding film engaged with an exterior of the shielding member, for shielding, disposing a metal plate to cover a first surface of the shielding member, mounting the heat conductive member on a first surface of the metal plate, mounting an insulation film on a second surface opposite to the first surface of the metal plate, disposing the heat conductive member to face a first surface of the electric element, in engagement with the first and second openings, mounting the metal plate on a first surface of the insulation film, and mounting at least one cooling member on a second surface opposite to the first surface of the insulation film. The insulation film may transfer heat to the heat conductive member to the at least one cooling member through the metal plate.

Figure 18:
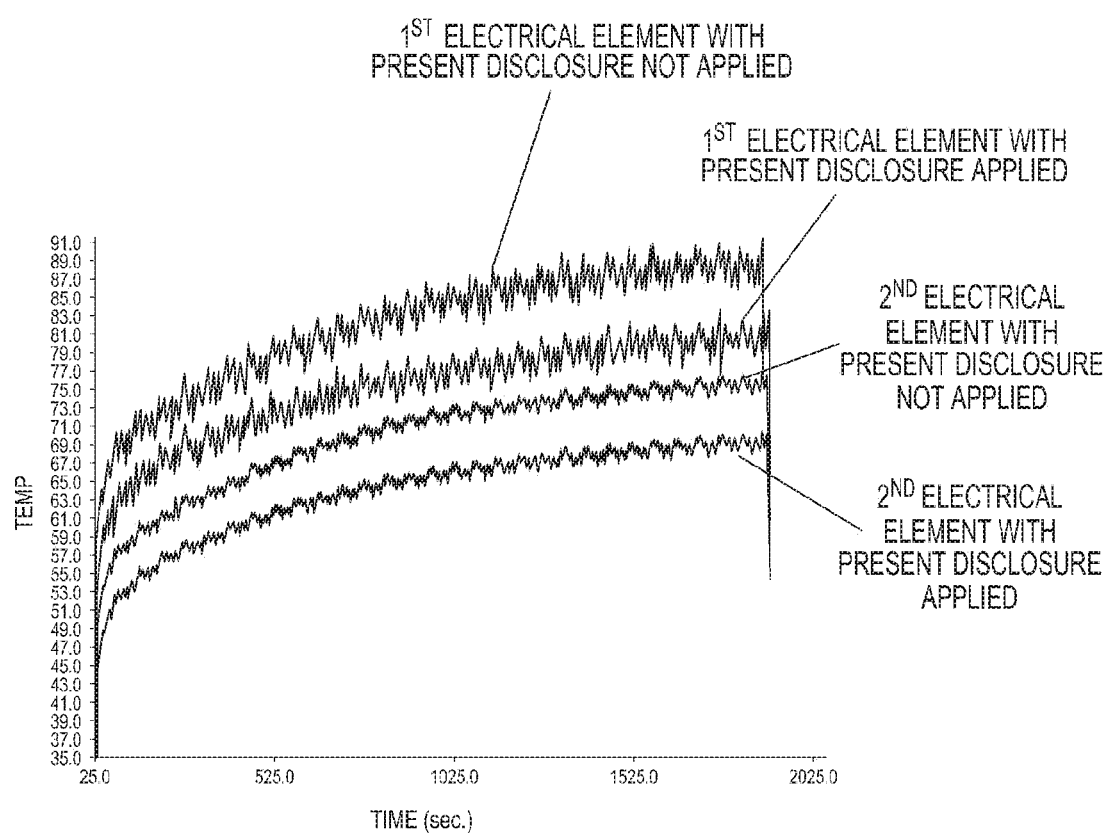
FIG. 18 is a graph illustrating variations in the temperature of first and second electric elements in an electronic device having a shielding member, according to various embodiments of the present disclosure.

FIG. 18 is a graph illustrating variations in the temperature of a first and a second electric elements (e.g., electronic element 190) applied to an electronic device 400 having a shielding member 420, according to various embodiments of the present disclosure.

Referring to FIG. 18, it may be noted that if the electronic device 400 is not applied to the first electric element, the temperature is 88.8° C., whereas if the electronic device 400 is applied to the first electric element, the temperature drops to 80.8° C. For example, a comparison between application of the electronic device 400 to the first electric element and non-application of the electronic device 400 to the first electric element reveals that the temperature of the first electric element is cooled and thus drops by 8° C. The first electric element may be a CPU.

It may be noted that if the electronic device 400 is not applied to the second electric element, the temperature is 76.1° C., whereas if the electronic device 400 is applied to the second electric element, the temperature drops to 69.0° C. For example, a comparison between application of the electronic device 400 to the second electric element and non-application of the electronic device 400 to the second electric element reveals that the temperature of the first electric element is cooled and thus drops by 7° C. The second electric element may be a CPU.

Accordingly, the electronic device used for the first and second electric elements may efficiently dissipate heat of the first and second electric elements.

Figure 19:
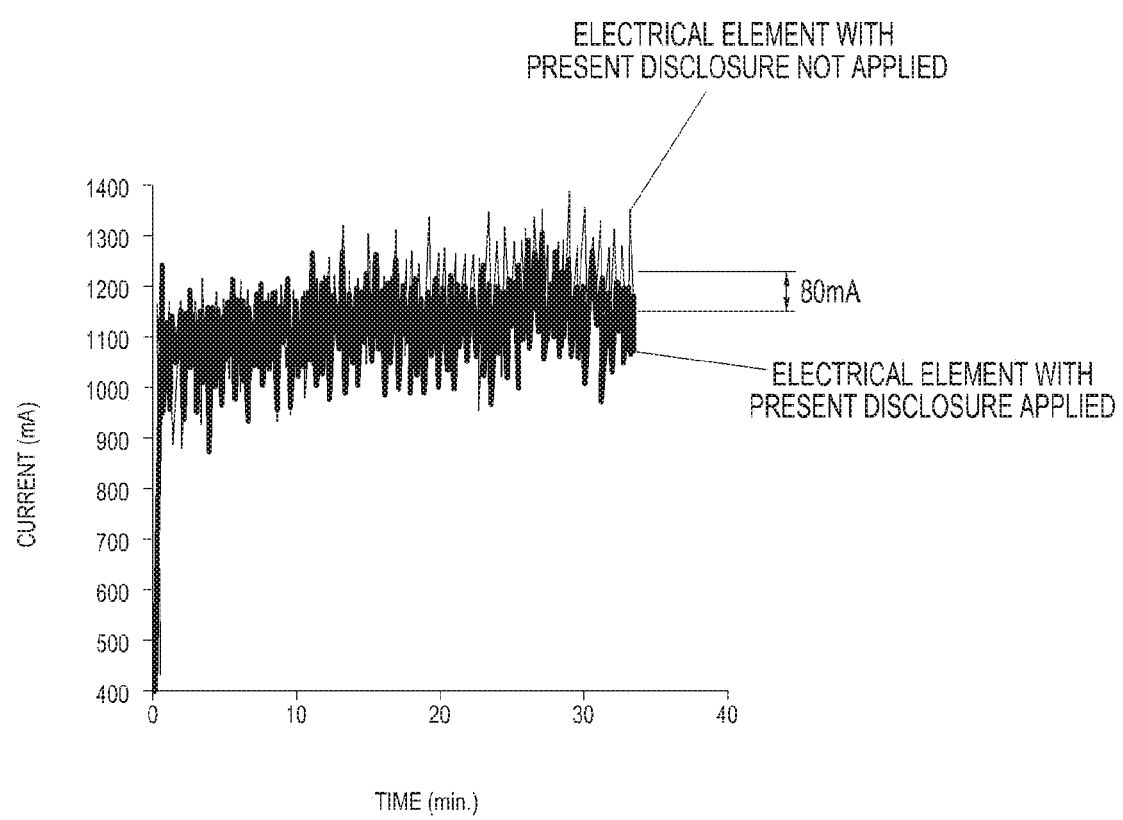
FIG. 19 is a graph illustrating variations in the current of an electric element in an electronic device having a shielding member, according to various embodiments of the present disclosure.

FIG. 19 is a graph illustrating variations in the current of an electric element 190 in an electronic device 400 having a shielding member 420, according to various embodiments of the present disclosure.

Referring to FIG. 19, it may be noted that if the electronic device 400 is not applied to the electric element, the current consumption is 1200 mA, whereas if the electronic device 400 is applied to the electric element, the current consumption drops to 1120 mA. For example, the current consumption drops by 80 mA.

Therefore, the electronic device 400 used for the electric element 190 may effectively reduce the current consumption of the electric element 190.

According to various embodiments of the present disclosure, as is apparent from the foregoing description, as a shielding member is configured to surround or cover at least a part of at least one electric element in an electronic device, the shielding member may dissipate heat of at least one electric element to the outside, while shielding electromagnetic waves to at least one electric element. Therefore, the performance degradation and malfunction of the electronic device may be prevented.

According to various embodiments of the present disclosure, a shielding member which is attached firmly in a small area of a substrate, shields electromagnetic waves of electric elements, and includes a shielding film surrounding the exterior of a PU foam compressed when being pressed by an external force. Thus, lift-up of a heat conductive member and the electric elements may be prevented.

When a cooling member is pressed by an external force, the shielding member of PU foam may be compressed, and at the same time, the heat conductive member may be brought into contact with the electric elements, in a face to face manner. Herein, as a conventional gap between the heat conductive member and the electric elements is eliminated, the lift-up of the heat conductive member from the electric elements may be prevented.

Accordingly, since a metal plate may contact the cooling member, the effect of cooling the electric elements and the cooling efficiency of the electronic device may be increased. The configuration of the shielding member that cools the electric elements by dissipating heat of the electric elements and shields electromagnetic waves of the electric elements may lead to improvement of the performance of the electronic device.

The above-described electronic devices including a shielding member according to various embodiments of the present disclosure are not limited by the foregoing embodiments and the drawings. Thus, it will be understood by those skilled in the art that various changes in form and details may be made therein without departing from the spirit and scope of the present disclosure as defined by the appended claims and their equivalents.

What is claimed is:
1. An electronic device comprising:
a substrate on which an electric element is disposed;
a shield can mounted on the electric element and including a first opening formed at a part facing the electric element;
a shielding member mounted around the first opening of the shield can and electrically connected to the shield can, the shielding member including a second opening formed at a second part facing the first opening of the shield can;
a metal plate mounted on the shielding member, with the second opening covered, and electrically connected to the shielding member;
at least one insulation film mounted on the metal plate and including a first surface facing the metal plate and a second surface opposite to the first surface;
at least one cooling member mounted on the second surface of the at least one insulation film; and
a heat conductive member mounted in the first opening and the second opening, interposed between the electric element and the metal plate, and in contact with the electric element and the metal plate,
wherein the shielding member is configured to be elastic and to be compressed by an external force,
wherein the shielding member comprises a body surrounded by a shielding film that includes a nanofiber film,
wherein the at least one cooling member comprises a heat pipe and a bracket,
wherein the heat pipe is engaged with the at least one insulation film, for receiving heat generated from the electric element through the metal plate and the heat conductive member and cooling the received heat, and wherein the bracket is engaged with the heat pipe, while being supported by the heat pipe, for absorbing and dissipating the heat of the heat pipe.

2. The electronic device of claim 1, wherein the heat conductive member includes a carbon fiber sheet, and the metal plate includes a copper (Cu) plate.

3. The electronic device of claim 1, further comprising a mounting insulation film for mounting thereon.

4. The electronic device of claim 1, wherein the body is formed of polyurethane (PU) foam.

5. The electronic device of claim 1, wherein the heat conductive member includes at least one of a liquid thermal interface material (TIM) and a solid TIM.

6. The electronic device of claim 4, wherein the body includes a magnetic material to increase a shielding force.

7. The electronic device of claim 1, wherein the shielding member further comprises at least one engagement protrusion to be engaged with at least one protrusion groove formed in the shield can.

8. The electronic device of claim 3, wherein the at least one insulation film comprises an insertion through hole for allowing the heat pipe to be inserted therethrough, to connect the metal plate directly to the heat pipe, and wherein an insulation coating is applied on an exterior of the heat pipe.

9. The electronic device of claim 1, wherein the shielding member surrounds a side surface of the electric element.

10. The electronic device of claim 1, wherein the shielding member surrounds a side surface of the electric element, and wherein the metal plate the shielding member and the electric element.

11. The electronic device of claim 10, wherein an overall shape of the metal plate is an n-shape, and each of both ends of the metal plate is shaped into one of a U-shape and an L-shape.

12. A method for assembling an electronic device, the method comprising:

creating a substrate including an electric element mounted thereon;

disposing a shield can including at least one first opening at a part facing the electric element on the substrate;

disposing a shielding member to cover a first surface of the shield can, the shielding member being compressed when being pressed, and including at least one second opening for discharging heat from the electric element, and a shielding film engaged with an exterior of the shielding member;

disposing a metal plate to cover a first surface of the shielding member, mounting a heat conductive member on a first surface of the metal plate, mounting an insulation film on a second surface opposite to the first surface of the metal plate, and disposing the heat conductive member to face a first surface of the electric element, in engagement with the at least one first and second openings; and mounting the metal plate on a first surface of the insulation film, and mounting at least one cooling member on a second surface opposite to the first surface of the insulation film, wherein the insulation film transfers heat from the heat conductive member to the at least one cooling member through the metal plate, wherein the at least one cooling member comprises a first cooling member and a second cooling member, wherein the first cooling member includes a heat pipe engaged with the insulation film included in the electronic device, for receiving heat generated from the electric element through the metal plate and the heat conductive member, and cooling the received heat, and wherein the second cooling member includes a bracket engaged with the first cooling member, while being supported by the first cooling member, for absorbing and dissipating the heat of the first cooling member.

13. The method of claim 12, wherein when the at least one cooling member is pressed down, the shielding member is compressed, and the heat conductive member is moved to contact the electric element.

14. The method of claim 12, wherein the shielding film is fabricated by cutting a nanofiber film.

15. The method of claim 14, wherein the cut shielding film is placed on a fixing jig.

16. The method of claim 12, wherein a body of the shielding member is engaged inside the shielding film.

17. The method of claim 16, wherein the body is formed of polyurethane foam.

18. The method of claim 16, wherein at least one engagement member protrudes outward from the shielding film and is folded and fixedly engaged with the body by at least one engagement jig.

* * * * *

UNITED STATES PATENT AND TRADEMARK OFFICE
CERTIFICATE OF CORRECTION

| | |
|---|---|
| PATENT NO. | : 11,178,799 B2 |
| APPLICATION NO. | : 15/938689 |
| DATED | : November 16, 2021 |
| INVENTOR(S) | : Hae-Jin Lee et al. |

It is certified that error appears in the above-identified patent and that said Letters Patent is hereby corrected as shown below:

In the Claims

In Column 25, Line 10, in Claim 3:
"a mounting insulation film for mounting thereon."
Should be:
-- a mounting insulation film for mounting the heat pipe thereon. --.

In Column 25, Line 34, in Claim 10:
"wherein the metal plate the shielding member and the"
Should be:
-- wherein the metal plate covers the shielding member and the --.

Signed and Sealed this
Nineteenth Day of December, 2023

*Katherine Kelly Vidal*

Katherine Kelly Vidal
*Director of the United States Patent and Trademark Office*